United States Patent
Yamaguchi et al.

(10) Patent No.: US 10,854,839 B2
(45) Date of Patent: Dec. 1, 2020

(54) ORGANIC EL DISPLAY PANEL AND METHOD OF MANUFACTURING ORGANIC EL DISPLAY PANEL

(71) Applicant: JOLED INC., Tokyo (JP)

(72) Inventors: Jun Yamaguchi, Tokyo (JP); Kenji Harada, Tokyo (JP); Shuhei Yada, Tokyo (JP)

(73) Assignee: JOLED INC., Tokyo (JP)

( * ) Notice: Subject to any disclaimer, the term of this patent is extended or adjusted under 35 U.S.C. 154(b) by 22 days.

(21) Appl. No.: 16/254,598

(22) Filed: Jan. 23, 2019

(65) Prior Publication Data

US 2019/0363279 A1 Nov. 28, 2019

(30) Foreign Application Priority Data

May 23, 2018 (JP) .................. 2018-098836

(51) Int. Cl.
```
H01L 29/08    (2006.01)
H01L 51/52    (2006.01)
H01L 51/56    (2006.01)
H01L 51/50    (2006.01)
H01L 27/32    (2006.01)
```
(52) U.S. Cl.
CPC ...... H01L 51/5228 (2013.01); H01L 27/3246 (2013.01); H01L 51/5072 (2013.01); H01L 51/5212 (2013.01); H01L 51/5256 (2013.01); H01L 51/56 (2013.01)

(58) Field of Classification Search
CPC ............. H01L 51/5228; H01L 27/3246; H01L 51/5072; H01L 51/5212; H01L 51/5256; H01L 51/56
See application file for complete search history.

(56) References Cited

U.S. PATENT DOCUMENTS

2014/0312329 A1* 10/2014 Fujii ................... H01L 51/5228
                                                                257/40
2016/0035803 A1*  2/2016 Kim .................... H01L 27/3246
                                                                257/40
2018/0287101 A1* 10/2018 Suzuki ................... H01L 51/56
2018/0366524 A1* 12/2018 Bang .................. H01L 51/0021

FOREIGN PATENT DOCUMENTS

JP       2006-261058 A       9/2006

* cited by examiner

*Primary Examiner* — Victor A Mandala
*Assistant Examiner* — Colleen E Snow
(74) *Attorney, Agent, or Firm* — Hauptman Ham, LLP

(57) ABSTRACT

An organic electroluminescence (EL) display panel includes a substrate; first electrodes spaced away from each other and arrayed in rows and columns above the substrate; light-emitting layers including organic light-emitting material and disposed above the first electrodes; a second electrode disposed above the light-emitting layers; a first protection layer including resin and disposed above the second electrode but not within an auxiliary region which, in plan view, extends in a column direction between ones of the first electrodes that are adjacent in a row direction across the substrate; a second protection layer including inorganic material and disposed above the first protection layer and the second electrode; and an auxiliary electrode layer extending in the column direction within the auxiliary region and electrically connecting to the second electrode through a contact opening in the first protection layer within the auxiliary region.

20 Claims, 17 Drawing Sheets

ORGANIC EL DISPLAY PANEL AND METHOD OF MANUFACTURING ORGANIC EL DISPLAY PANEL

This application claims priority to Japanese Patent Application No. 2018-098836 filed May 23, 2018, the contents of which are hereby incorporated by reference in its entirety.

BACKGROUND

Technical Field

The present disclosure relates to an organic electroluminescence (EL) display panel that makes use of electroluminescence of an organic material and a method of manufacturing such an organic EL display panel.

Description of Related Art

Recently, as display panels used for display devices such as digital televisions, organic EL display panels in which a plurality of organic EL elements are arranged in a matrix on a substrate are in practical use.

In a typical organic EL display panel, light-emitting layers of the organic EL elements are partitioned from adjacent organic EL elements by banks made of an electrically-insulating material. In an organic EL display panel for color display, the organic EL elements form subpixels each emitting light of one of red (R), green (G), and blue (B) (hereinafter simply referred to as R, G, and B), and each combination of adjacent ones of the subpixels of R, G, and B forms a unit pixel in color display.

The organic EL elements each have a basic structure in which a light-emitting layer including an organic light-emitting material (organic light-emitting layer) between a pair of electrodes, and when driven, a voltage is applied between the pair of electrodes and light emission is achieved in accordance with recombination of holes and electrons injected into the light-emitting layer.

A top-emission type organic EL element has an element structure in which a pixel electrode, organic layers (including the light-emitting layer), and a common electrode are disposed in this order on the substrate. Light emitted from the light-emitting layer is reflected at the pixel electrode made of a light-reflective material and is emitted upwards from the common electrode made of a light-transmissive material. The common electrode often spans over an entire surface of an image display region on the substrate.

In accordance with development of organic EL display panels of greater sizes for use in large-screen display devices such as televisions, electrical resistance of the common electrode may become greater and light-emitting efficiency may deteriorate in portions that are distant from an electric power supply portion because of insufficient supply of current due to voltage decline, and consequently luminance unevenness may occur.

In view of this, for example, in Japanese Patent Application Publication No. 2006-261058, an electrically-conductive electrode (auxiliary electrode) is disposed on a protection layer on the common electrode and suppresses voltage decline in the common electrode by electrically connecting the auxiliary electrode and the common electrode through a contact hole in the protection layer.

However, the protection layer typically is made of an inorganic material such as silicon nitride (SiN). Such inorganic materials have a great light-transmittance, moisture tolerance, and electrically-insulating property, but also have a disadvantage that cracks appear easily. Accordingly, in order to sufficiently protect the organic EL elements, the protection layer needs to have a relatively great film thickness.

Due to this, a time period required for forming the contact holes (task time) is long, and consequently states of inner side surfaces of the contact holes deteriorate and even when a metal for the auxiliary electrodes is vapor-deposited, sufficient coverage (covered area) of a metal layer cannot be obtained. As a result, the auxiliary electrodes have great electrical resistance and insufficient electrical connection to the common electrode.

SUMMARY

An organic EL display panel pertaining to at least one embodiment of the present disclosure includes a substrate. the organic EL display panel further includes a plurality of first electrodes that are spaced away from each other and are arrayed in rows and columns above the substrate. The organic EL display panel further includes a plurality of light-emitting layers that include organic light-emitting material and are disposed above the first electrodes. The organic EL display panel further includes a second electrode that is disposed above the light-emitting layers. The organic EL display panel further includes a first protection layer that includes resin and is disposed above the second electrode and is not disposed within an auxiliary region which, in plan view, extends in a column direction between ones of the first electrodes that are adjacent in a row direction across the substrate. The organic EL display panel further includes a second protection layer that includes inorganic material and is disposed above the first protection layer and the second electrode. The organic EL display panel further includes an auxiliary electrode layer that extends in the column direction within the auxiliary region and is electrically connected to the second electrode through a contact opening in the first protection layer within the auxiliary region.

An organic EL display panel manufacturing method pertaining to at least one embodiment of the present disclosure includes preparing a substrate. The method further includes forming a plurality of first electrodes that are spaced away from each other and are arrayed in rows and columns above the substrate. The method further includes forming a plurality of light-emitting layers that include organic light-emitting material above the first electrodes. The method further includes forming a second electrode above the light-emitting layers. The method further includes forming a first protection layer through applying resin material above the second electrode excluding an auxiliary region which, in plan view, extends in a column direction between ones of the first electrodes that are adjacent in a row direction across the substrate. The method further includes forming a second protection layer through applying inorganic material above the first protection layer and the second electrode. The method further includes forming a contact opening in the second protection layer within the auxiliary region. The method further includes forming an auxiliary electrode layer within the auxiliary region in the column direction, the auxiliary electrode layer electrically connecting to the second electrode through the contact opening.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure. In the drawings.

DETAILED DESCRIPTION

<<Circumstances Leading to Embodiments of Present Disclosure>>

FIG. 18A, FIG. 18B, FIG. 18C, FIG. 18D, and FIG. 18E are schematic cross-sectional diagrams of processes of manufacturing auxiliary electrodes in a hypothetical organic EL display panel.

Figure 18A:
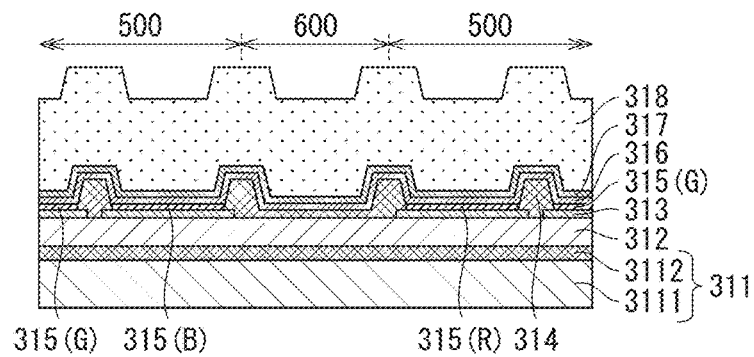
FIG. 18A, FIG. 18B, FIG. 18C, FIG. 18D, and FIG. 18E are each a schematic cross-sectional diagram of a part of processes of forming a hypothetical organic EL display panel for describing circumstances leading to an embodiment of the present disclosure.

FIG. 18A is a schematic cross-sectional diagram of a portion of an organic EL display panel before forming of the auxiliary electrodes. In FIG. 18A, an interlayer insulating layer 312 is formed on a substrate 311 including a base member 3111 and a thin film transistor (TFT) layer 3112, a plurality of banks 314 are formed on the interlayer insulating layer 312, and pixel electrodes 313 and light-emitting layers 315 are formed in regions between adjacent banks 314 excluding auxiliary electrode forming regions 600 to form light-emitting regions 500.

An electron transport layer 316 and a common electrode 317 are laminated to span over the auxiliary electrode forming regions 600 and the light-emitting regions 500, and a protection layer 318 is formed above the common electrode 317 to protect organic EL elements below the protection layer 318.

Typically, the protection layer 318 has a single-layered or multi-layered structure in which an inorganic material such as silicon nitride are deposited through vapor deposition or sputtering. Cracks easily appear in such an inorganic layer, and such an inorganic layer needs to have a relatively great film thickness (for example, a film thickness from 2 μm to 10 μm) such that the inorganic layer is laminated to cover any minute impurity on the common electrode 317 and the protection layer has a sufficient liquid proofing.

Figure 18B:
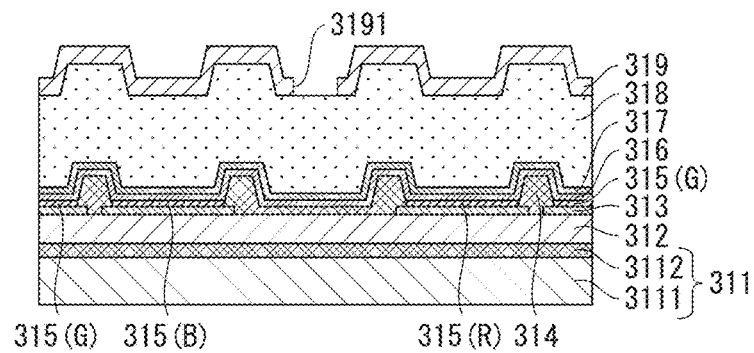

When forming the contact holes in the auxiliary electrode forming regions 600 of the protection layer 318, first, a mask 319 having a resistance against etching (hereinafter referred to as "hard mask"; mainly an ITO film) is formed on an upper surface of the protection layer 318, and the hard mask is patterned through photolithography to form openings 3191 in regions of the hard mask 319 where the contact holes are to be formed (FIG. 18B).

Figure 18C:
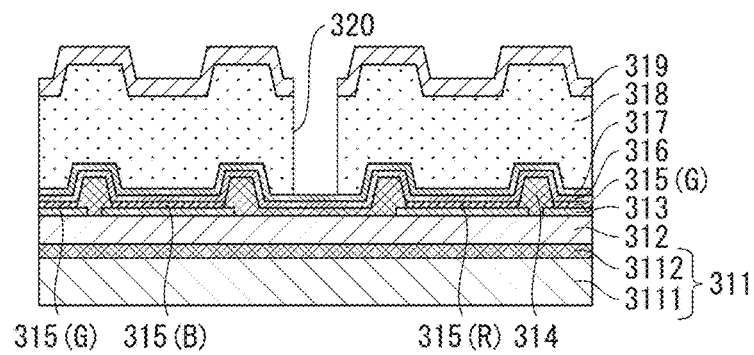
Figure 18D:
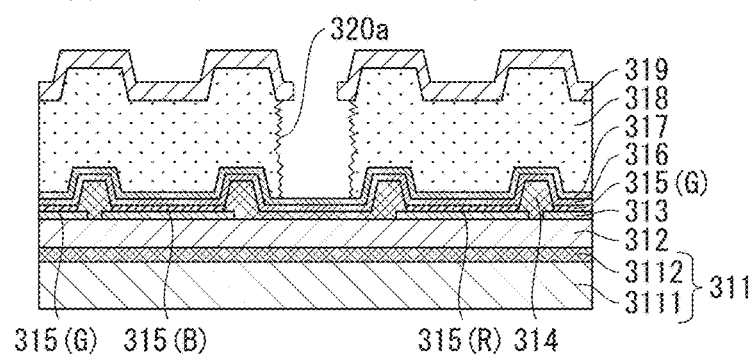
Figure 18E:
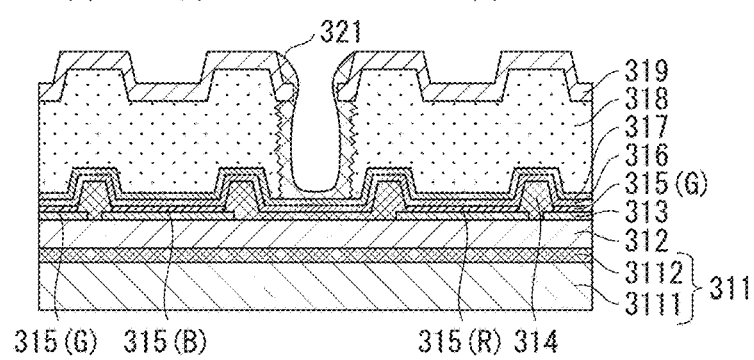

Then, the contact holes 320 are bored in the protection layer 318 through anisotropic dry etching (FIG. 18C). However, the protection layer 318 has a relatively great film thickness as described above, and therefore takt time until boring of the contact holes 320 is fully completed is long. Further, even when performing anisotropic etching, performing etching for a long time period often yields side etching 320a on the inner side surfaces of the contact holes 320, and consequently inner surfaces of the contact holes 320 have bad surface states (FIG. 18D).

Even if the auxiliary electrodes 321 made of metal are formed in the contact holes 320 in such states through vapor deposition or sputtering, coverage (covered area) of the metal film relative to the inner side surfaces of the contact holes 320 may be bad, and the auxiliary electrodes 321 may have great electrical resistance. Consequently, the effect of suppressing voltage decline of the common electrode 317 that is expected for the auxiliary electrodes 321 may not be sufficiently obtained.

In view of this, the inventors of the present disclosure conducted research to develop a structure in which protection by the protection layer of the organic EL elements is sufficiently ensured, takt time for forming the contact holes is shortened, and good electrical conductivity of the auxiliary electrodes and electrical connection of the auxiliary electrodes to the common electrode is maintained, and arrived at an embodiment of the present disclosure.

<<Overview>>

An organic EL display panel pertaining to at least one embodiment of the present disclosure includes a substrate. the organic EL display panel further includes a plurality of first electrodes that are spaced away from each other and are arrayed in rows and columns above the substrate. The organic EL display panel further includes a plurality of light-emitting layers that include organic light-emitting material and are disposed above the first electrodes. The organic EL display panel further includes a second electrode that is disposed above the light-emitting layers. The organic EL display panel further includes a first protection layer that includes resin and is disposed above the second electrode and is not disposed within an auxiliary region which, in plan view, extends in a column direction between ones of the first electrodes that are adjacent in a row direction across the substrate. The organic EL display panel further includes a second protection layer that includes inorganic material and is disposed above the first protection layer and the second electrode. The organic EL display panel further includes an auxiliary electrode layer that extends in the column direction within the auxiliary region and is electrically connected to the second electrode through a contact opening in the first protection layer within the auxiliary region.

This structure helps to ensure electrical conductivity of the auxiliary electrode layer, to improve electrical connection of the auxiliary electrode layer with the second electrode that is a common electrode, to improve light-emitting efficiency of the organic EL display panel, and to suppress luminance unevenness of the organic EL display panel.

An organic EL display panel pertaining to at least one embodiment of the present disclosure further includes partition walls. In plan view of the substrate, the partition walls extend in the column direction and are disposed between the auxiliary region and regions where the light-emitting layers are disposed.

This embodiment helps to prevent, when forming the first protection layer made of a resin material through a wet process, the resin material from flowing into the auxiliary region within which the auxiliary electrode layer is formed.

An organic EL display panel pertaining to at least one embodiment of the present disclosure further includes second partition walls. The partition walls are first partition walls. In plan view of the substrate, the second partition walls extend in the column direction and are disposed between the first partition walls and the auxiliary electrode layer.

This helps to further suppress flowing of the resin material into the auxiliary region within which the auxiliary electrode layer is formed.

According to an organic EL display panel pertaining to at least one embodiment of the present disclosure, the second partition walls have a greater height than the first partition walls.

An organic EL display panel pertaining to at least one embodiment of the present disclosure further includes banks extending in the column direction and partitioning the organic light-emitting layers arrayed in the column direction. The first partition walls and the second partition walls have greater heights than the banks.

These embodiments help to further suppress flowing of the resin material into the auxiliary region within which the auxiliary electrode layer is formed.

An organic EL display panel pertaining to at least one embodiment of the present disclosure further includes banks extending in the column direction and partitioning the organic light-emitting layers arrayed in the column direction. The partition walls are ones of the banks that are closest to the auxiliary region.

According to this, non-light-emitting columns have a small width in the row direction, and such a structure is appropriate for obtaining improved definition.

According to an organic EL display panel pertaining to at least one embodiment of the present disclosure, a width of the partition walls in the row direction is greater than a width of the banks, excluding the partition walls, in the row direction.

According to an organic EL display panel pertaining to at least one embodiment of the present disclosure, a distance between the partition walls in the auxiliary region in the row direction is greater than a distance between each pair of adjacent ones of the banks, excluding the partition walls, in the row direction.

Any of these embodiments helps to suppress flowing of the resin material into the auxiliary region within which the auxiliary electrode layer is formed.

An organic EL display panel pertaining to at least one embodiment of the present disclosure further includes an electric charge movement facilitating layer below the second electrode and above the light-emitting layers and the auxiliary region. The organic EL display panel further includes a second auxiliary electrode layer extending in the column direction and electrically contacting a surface of the electric charge movement facilitating layer opposite the second electrode within the auxiliary region. The auxiliary electrode layer is referred to as a first auxiliary electrode layer.

This further helps to suppress voltage decline of the second electrode and to display images having good light-emitting efficiency and without luminance unevenness.

According to an organic EL display panel pertaining to at least one embodiment of the present disclosure, the second auxiliary electrode layer includes the same material as the first electrodes and is in the same layer as the first electrodes.

According to this embodiment, the second auxiliary electrode layer is formed simultaneously with the first electrodes during the process of forming the first electrodes. This has an effect of helping to suppress manufacturing costs.

An organic EL display panel pertaining to at least one embodiment of the present disclosure further includes a third protection layer that includes inorganic material and is disposed between the second electrode and the first protection layer.

This embodiment further helps to improve a sealing property of the protection layer.

According to an organic EL display panel pertaining to at least one embodiment of the present disclosure, the second protection layer is disposed between the auxiliary electrode layer and the first protection layer.

An organic EL display panel manufacturing method pertaining to at least one embodiment of the present disclosure includes preparing a substrate. The method further includes forming a plurality of first electrodes that are spaced away from each other and are arrayed in rows and columns above the substrate. The method further includes forming a plurality of light-emitting layers that include organic light-emitting material above the first electrodes. The method further includes forming a second electrode above the light-emitting layers. The method further includes forming a first protection layer through applying resin material above the second electrode excluding an auxiliary region which, in plan view, extends in a column direction between ones of the first electrodes that are adjacent in a row direction across the substrate. The method further includes forming a second protection layer through applying inorganic material above the first protection layer and the second electrode. The method further includes forming a contact opening in the second protection layer within the auxiliary region. The method further includes forming an auxiliary electrode layer within the auxiliary region in the column direction, the auxiliary electrode layer electrically connecting to the second electrode through the contact opening.

The manufacturing method pertaining to the above embodiment helps to manufacture an organic EL display panel that efficiently suppresses voltage decline of the second electrode that is the common electrode to display images having good light-emitting efficiency and little luminance unevenness.

Embodiment

The following describes an organic EL display panel pertaining to at least one embodiment of the present disclosure, with reference to the drawings. Note that the drawings may be schematic for convenience of explanation, and dimensions, an aspect ratio, or the like of components may differ from the actual dimensions, aspect ratio, or the like.

1. Overall Structure of Organic EL Display Device 1

Figure 1:
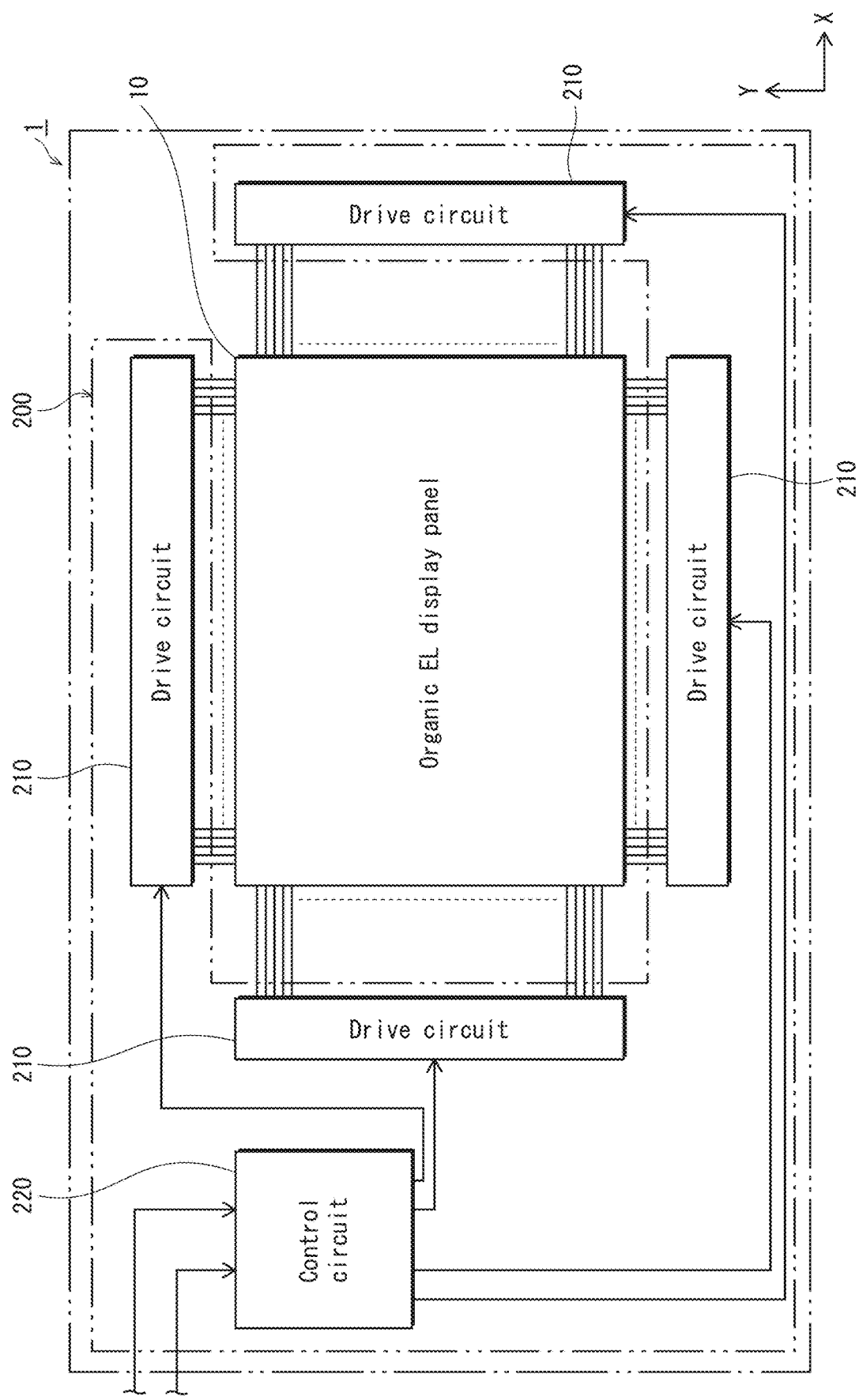
FIG. 1 is a block diagram of an overall structure of an organic EL display device 1 pertaining to at least one embodiment.

FIG. 1 is a block diagram of an overall structure of an organic EL display device 1 pertaining to at least one embodiment. The organic EL display device 1 is, for example, a display device used for a television, a personal computer, a portable terminal, a commercial display (an electronic signage or a large-sized screen for installment in a commercial facility), or the like.

The organic EL display device 1 includes an organic EL display panel 10 and a drive control unit 200 electrically connected to the organic EL display panel 10.

In the present embodiment, the organic EL display panel 10 is a top-emission type display panel whose upper surface is a rectangular image display surface. In the organic EL display panel 10, a plurality of organic EL elements (not illustrated) are arrayed along the image display surface, and an image is displayed with use of a combination of light emitted from the organic EL elements. Note that the organic EL display panel 10 is, for example, an active matrix type of panel.

The drive control unit 200 includes drive circuits 210 connected to the organic EL display panel 10 and a control circuit 220 connected to an external device such as a calculator or a receiving device such as an antenna. The drive circuits 210 each include a power supply circuit that supplies electric power to the organic EL elements, a signal circuit that applies a voltage signal controlling electric power supplied to the organic EL elements, and a scanning circuit that switches, at defined intervals, a position to which the voltage signal is applied.

The control circuit 220 controls operations of the drive circuits 210 in accordance with data including image information inputted from the external device or the receiving device.

FIG. 1 shows an example in which four drive circuits 210 are arranged around the organic EL display panel 10, but note that the structure of the drive control unit 200 is not limited to this; the number and positions of the drive circuits 210 can be appropriately changed. Further, in the following, as in FIG. 1, a direction along a longer side of the upper surface of the organic EL display panel 10 is referred to as an X direction, and a direction along a shorter side of the upper surface of the organic EL display panel 10 is referred to as a Y direction for convenience of explanation.

2.2. Structure of Organic EL Display Panel 10

(A) Structure in Plan View

Figure 2:
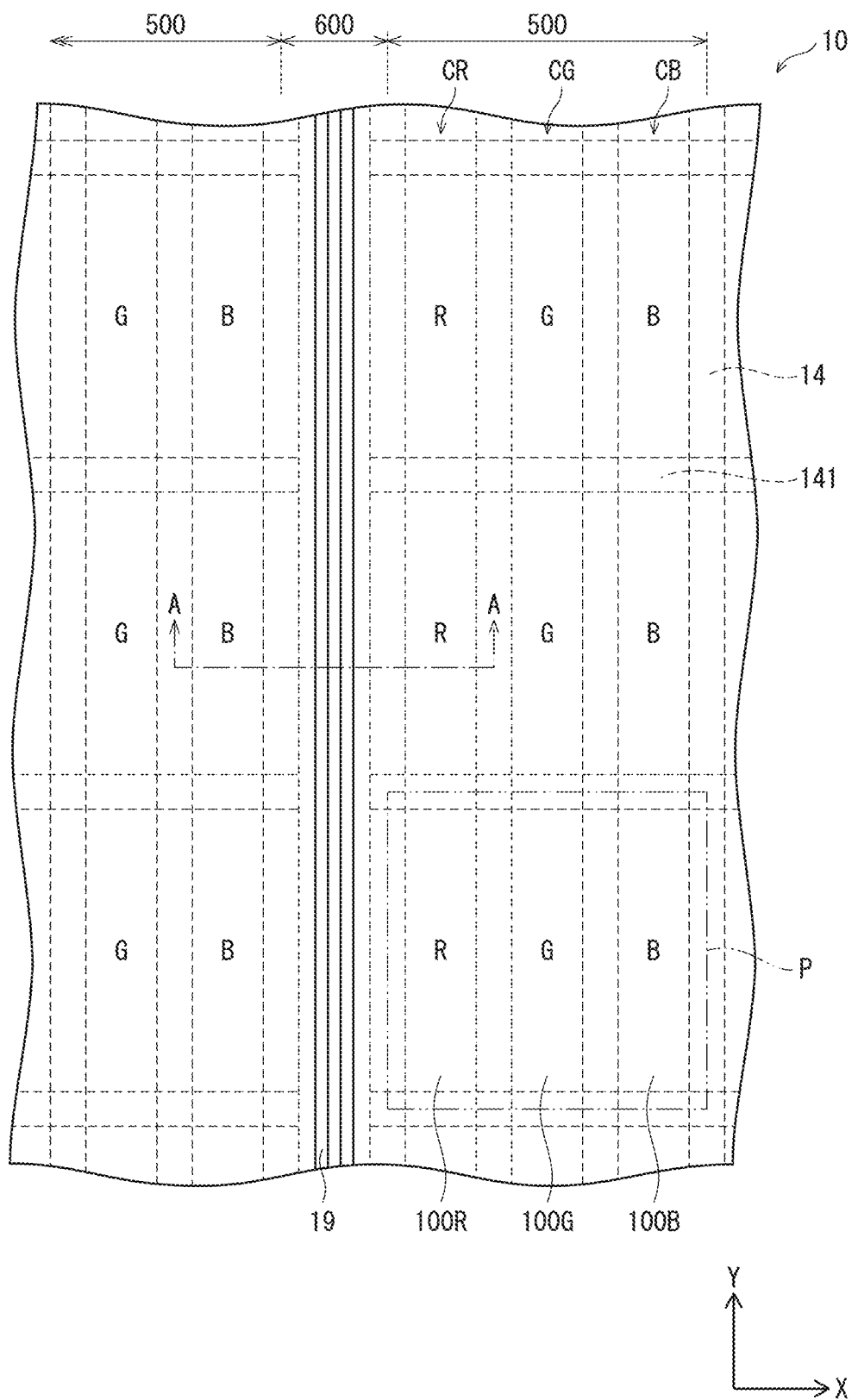
FIG. 2 is a schematic plan diagram in which a part of an image display surface of an organic EL display panel pertaining to at least one embodiment is enlarged.

FIG. 2 is a schematic plan diagram in which a part of the image display surface of the organic EL display panel 10 pertaining to at least one embodiment is enlarged. In the organic EL display panel 10, for example, subpixels 100R emitting light of the color R, subpixels 100G emitting light of the color G, and subpixels 100B emitting light of the color B are arranged in a matrix. The subpixels 100R, the subpixels 100G, and the subpixels 100B are arranged alternatingly in the X direction, and each set of a subpixel 100R, a subpixel 100G, and a subpixel 100B that are arrayed in the X direction forms a pixel P.

Figure 3:
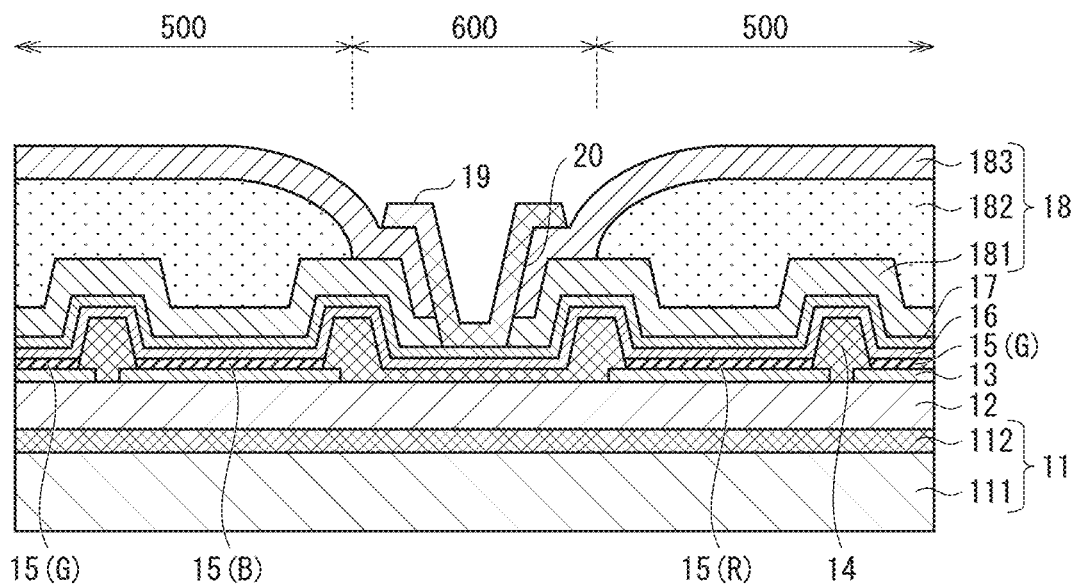
FIG. 3 is a schematic cross-sectional diagram of the organic EL display panel pertaining to at least one embodiment, taken along line A-A in FIG. 2.

The subpixels 100R each include an organic EL element 2 emitting light of the color R, the subpixels 100G each include an organic EL element 2 emitting light of the color G, and the subpixels 100B each include an organic EL element 2 emitting light of the color B (see FIG. 3). Through combining luminance of the subpixels 100R, 100G, and 100B that are subjected to a gradation control, a full-color representation is achieved.

In the Y direction, the subpixels 100R are arrayed to form subpixel arrays CR, the subpixels 100G are arrayed to form subpixel arrays CG, and the subpixels 100B are arrayed to form subpixel arrays CB. Due to this, the pixels P are arranged in a matrix along the X direction and the Y direction in an entirety of the organic EL display panel 10, and an image is displayed in the image display surface through combining color emission from the pixels P, which are arranged in a matrix.

The organic EL display panel 10 pertaining to the present embodiment employs a so-called line bank structure. That is, a plurality of banks 14 that partition the subpixel arrays CR, CG, and CB into columns are arranged in the X direction at intervals, and in each of the subpixel arrays CR, CG, and CB, an organic light-emitting layer spans over the subpixels 100R in the subpixel arrays CR, the subpixels 100G in the subpixel arrays CG, or the subpixels 100B in the subpixel arrays CB, respectively.

In each of the subpixel arrays CR, CG, and CB, a plurality of pixel regulation layers 141 that electrically insulate between the subpixels 100R, the subpixels 100G; or the subpixels 100B are arranged at intervals in the Y direction, and each of the subpixels 100R, 100G, and 100B is configured to emit light independently from one another.

The pixel regulation layers 141 have a height lower than surfaces of the light-emitting layers. The banks 14 and the pixel regulation layers 141 are illustrated by broken lines in FIG. 2. This is because the pixel regulation layers 141 and the banks 14 are not exposed at a surface of the image display surface and are arranged inside the image display surface.

Here, when referring to each region formed by a set of a subpixel array CR, a subpixel array CG, and a subpixel array CB as a light-emitting region 500 (light-emitting portion), between each pair of adjacent ones of the light-emitting regions 500, an auxiliary electrode forming region 600 (non-light-emitting portion) extending in parallel with the subpixel arrays is disposed.

In the auxiliary electrode forming regions 600, no organic EL element is disposed, and approximately at centers of the auxiliary electrode forming regions 600 in the X direction, elongated auxiliary electrodes 19 extending in the Y direction are disposed.

(B) Cross-Sectional Structure of Organic EL Elements

As described above, in the organic EL display panel 10, a pixel includes three subpixels each emitting light of a different one of the colors R, G, and B. Each of the subpixels include an organic EL element emitting light of a corresponding color.

Structures of the organic EL elements of the three colors are substantially the same as one another, and therefore are simply referred to as the organic EL elements 2 when they are not distinguished from one another.

FIG. 3 is a schematic cross-sectional diagram taken along line A-A in FIG. 2.

In FIG. 3, in the present embodiment, the organic EL elements 2 each include a substrate 11, an interlayer insulating layer 12, a pixel electrode 13, a bank 14, a light-emitting layer 15, an electron transport layer 16, a common electrode 17, a protection layer 18, and an auxiliary electrode 19.

The substrate 11, the interlayer insulating layer 12, the electron transport layer 16, the common electrode 17, and the protection layer 18 are not in one-to-one correspondence with the pixels but each spans over the plurality of organic EL elements 2 of the organic EL display panel 10.

(1) Substrate

The substrate 11 includes: a base member 111 that is made of an electrically-insulating material; and a thin film transistor (TFT) layer 112. The TFT layer 112 includes drive circuits corresponding one-to-one with the subpixels. The base member 111 may be, for example, a glass substrate; a silica glass substrate; a silicon substrate; a metal substrate of a metal such as molybdenum sulfide, copper, zinc, aluminum, stainless steel, magnesium, iron, nickel, gold, silver, or the like; a semiconductor substrate such as gallium arsenide; a plastic substrate, or similar.

For a plastic material for the plastic substrate, a thermoplastic resin or a thermosetting resin may be used. For example, polyethylene; polypropylene; polyamide; polyimide (PI); polycarbonate; an acrylic resin; polyethylene terephthalate (PET); polybutylene terephthalate; polyacetal; other fluorine-based resins; thermoplastic elastomer such as styrenic elastomer, polyolefin elastomer, polyvinyl chloride elastomer, polyurethane elastomer, fluorine rubber elastomer, and chlorinated polyethylene elastomer; an epoxy resin; an unsaturated polyester; a silicone resin; polyurethane, or the like, or copolymer, blend, polymer alloy or the like mainly including such a material, primarily consisting of one of the above, or a layered body including layers of one or more of the above can be used.

(2) Interlayer Insulating Layer

The interlayer insulating layer 12 is disposed on the substrate 11. The interlayer insulating layer 12 is made of a resin material and planarizes unevenness of an upper surface of the TFT layer 112. For the resin material, for example, a positive photosensitive material is used. Examples of such a photosensitive material are an acrylic resin, a polyimide resin, a siloxane resin, and a phenolic resin. Further, although not illustrated in the cross-sectional diagram of FIG. 3, the interlayer insulating layer 12 has contact holes corresponding one-to-one with the subpixels.

(3) Pixel Electrodes

The pixel electrodes 13 each include a metal layer made of a light-reflective metal material and are disposed on the interlayer insulating layer 12. The pixel electrodes 13 correspond one-to-one with the subpixels and are electrically connected to the TFT layer 112 through the contact holes (not illustrated).

In the present embodiment, the pixel electrodes 13 function as anodes.

Specific examples of a metal material having light-reflectivity are silver (Ag); aluminum (Al); an aluminum alloy; molybdenum (Mo); a silver, palladium, and copper alloy (APC); a silver, rubidium, gold alloy (ARA); a molybdenum chromium alloy (MoCr); a molybdenum tungsten alloy (MoW); a nickel chromium alloy (NiCr), and the like.

The pixel electrodes 13 may each be a single metal layer or may each have a layered structure in which a layer made of a metal oxide such as indium tin oxide (ITO) or indium zinc oxide (IZO) is laminated on a metal layer.

(4) Banks and Pixel Regulation Layers

The banks 14 partition the pixel electrodes 13, which are arranged above the substrate 11 in one-to-one correspondence with the subpixels, in the X direction (see FIG. 2) into columns. The banks 14 each have a shape of a line bank extending in the Y direction between the subpixel arrays CR, CG, and CB, which are arrayed in the X direction.

The banks 14 are made using an electrically-insulating material. Specific examples of the electrically-insulating material are electrically-insulating organic materials (such as an acrylic resin, a polyimide resin, a novolac resin, a phenolic resin, and the like).

The banks 14 function as a structure for preventing, when the light-emitting layers 15 are formed through an application process, the applied ink of each color from flowing out and mixing.

When a resin material is used, the resin material beneficially has photosensitivity from the perspective of workability. The resin material may have positive photosensitivity or negative photosensitivity.

The banks 14 beneficially have a tolerance for organic solvents and heat. Further, in order to suppress flowing out of the ink, surfaces of the banks 14 beneficially have defined liquid repellency.

In portions where the pixel electrodes 13 are not disposed, bottom surfaces of the banks 14 are in contact with an upper surface of the interlayer insulating layer 12.

The pixel regulation layers 141 are made of an electrically-insulating material, cover edges of the pixel electrodes 13 that are adjacent in the Y direction (FIG. 2) in each of the subpixel arrays, and partition the pixel electrodes 13 that are adjacent in the Y direction.

The pixel regulation layers 141 are designed to have a film thickness slightly greater than the film thickness of the pixel electrodes 13 but smaller than the thickness of the light-emitting layers 15 up to their upper surfaces. Due to this, in each of the subpixel arrays CR, CG, and CB, the light-emitting layer 15 is not partitioned by the pixel regulation layers 141. Accordingly, flow of the ink is not prevented when forming the light-emitting layers 15. Due to this, in each of the subpixel arrays, the light-emitting layer 15 easily has a uniform thickness.

Due to the above-described structure, the pixel regulation layers 141 improve an electrically-insulating property of the pixel electrodes 13 that are adjacent in the Y direction and play the roles of preventing, in each of the subpixel arrays CR, CG, and CB, the organic light-emitting layer 15 from being discontinuous due to height differences, improving the electrically-insulating property between the pixel electrodes 13 and the common electrode 17, and the like.

Specific examples of the electrically-insulating material used for the pixel regulation layers 141 are resin materials, inorganic materials, and the like that are exemplified as a material of the banks 14 described above. Further, surfaces of the pixel regulation layers 141 beneficially have a lyophilic property for inks such that wet-spreading of inks is good when forming the light-emitting layers 15, which are layers on the pixel regulation layers 141.

Note that the pixel regulation layers 141 are not disposed in the auxiliary electrode forming regions 600.

(5) Light-Emitting Layers

The light-emitting layers 15 are disposed between the banks 14 in the light-emitting regions 500, and have a function of emitting light of the colors R, G, or B through recombination of holes and electrons. Note that the light-emitting layers 15 are referred to as the light-emitting layers 15(R), the light-emitting layers 15(G), and the light-emitting layers 15(B) when it is necessary to specify their light-emission colors.

For a material of the light-emitting layers 15, a publicly known material can be used. Specifically, for example, the light-emitting layers 15 are beneficially made of a fluorescent substance such as an oxynoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, or rare earth metal complex.

(6) Electron Transport Layer

The electron transport layer 16 has a function of transporting electrons from the common electrode 17 to the light-emitting layers 15. The electron transport layer 16 is made of an organic material having a high electron transport property, and includes neither alkali metals nor alkaline earth metals.

For the organic material of the electron transport layer 16, for example, a π electron system small-molecule organic material such as an oxadiazole derivative (OXD), a triazole derivative (TAZ), a phenanthroline derivative (BCP, Bphen), or the like can be used.

(7) Common Electrode

The common electrode 17 is made of a light-transmissive electrically-conductive material and is disposed on the electron transport layer 16. The common electrode 17 functions as a cathode.

For a material of the common electrode 107, ITO; IZO; a metal such as silver, a silver alloy, aluminum, an aluminum alloy; or the like is beneficially used. When forming the common electrode 17 using a metal, the common electrode 17 is formed as a thin film having a film thickness of approximately 20 nm or less, such that the common electrode 17 has a light-transmittance.

(8) Protection Layer

The protection layer 18 is disposed in order to prevent the components of the organic EL elements below the protection layer 18, specifically organic layers such as the light-emitting layers 15, the electron transport layer 16, or the like from deteriorating due to exposure to moisture or other liquids or to air.

In the present embodiment, in the light-emitting regions 500, the protection layer 18 includes a first protection sublayer 181 (third protection layer), second protection sublayers 182 (first protection layer), and a third protection sublayer 183 (second protection layer) that are light-transmissive.

The first protection sublayer 181 is a thin film of silicon nitride (SiN) and covers an upper surface of the common electrode 17.

The second protection sublayers 182 are made of resin and cover an upper surface of the first protection sublayer 181 excluding the auxiliary electrode forming regions 600 and regions surrounding the auxiliary electrode forming regions 600. For a resin material of the second protection sublayers 182, for example, a fluorine-based resin, an acrylic resin, an epoxy resin, a silicone resin, or the like is used.

The third protection sublayer 183 is a thin film of silicon nitride similar to the first protection sublayer 181 and covers upper surfaces of the second protection sublayers 182.

Due to the three-layered structure of the protection layer 18 as described above, the resin of the second protection sublayers 182 compensates for vulnerability of the first protection sublayer 181 and the third protection sublayer 183 that are each made of an inorganic layer, and even when a minute impurity exists on the common electrode 17, such an impurity is sufficiently covered and occurrence of cracks and liquid proofing deterioration are prevented.

Note that, in the auxiliary electrode forming regions 600 and regions surrounding the organic EL display panel 10, the first protection sublayer 181 and the third protection sublayer 183 are in direct and close contact with each other without the second protection sublayers 182 disposed therebetween.

(9) Auxiliary Electrodes

The auxiliary electrodes 19 are made of a metal having great electrical conductivity. For the metal material of the auxiliary electrodes 19, a metal such as silver, aluminum, copper, or the like can be used.

(10) Others

Although not illustrated in FIG. 3, an antiglare polarizing plate or an upper substrate may be joined onto the protection layer 18 through adhesive. Through joining such a layer, the components of the organic EL elements 2, specifically organic layers, are further protected from moisture, air, and the like.

3. Organic EL Display Panel Manufacturing Method

The following describes a method of manufacturing the organic EL display panel 10, with reference to the drawings.

Figure 4:
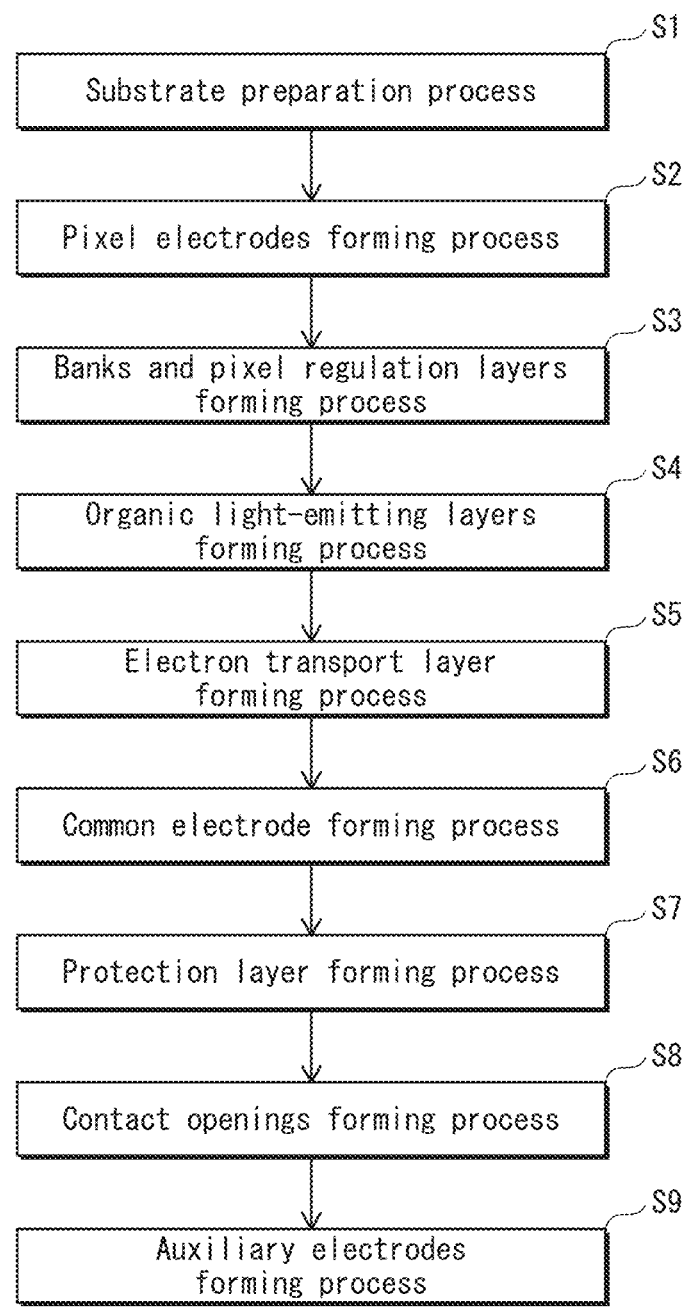
FIG. 4 is a flowchart of processes of manufacturing the organic EL display panel pertaining to at least one embodiment.

FIG. 4 is a flowchart of processes of manufacturing the organic EL display panel 10 pertaining to at least one embodiment, and FIG. 5A, FIG. 5B, FIG. 5C, FIG. 6A, FIG. 6B, and FIG. 6C are schematic cross-sectional diagrams of processes of forming the auxiliary electrodes in manufacturing of the organic EL display panel 10 pertaining to at least one embodiment.

(1) Substrate Preparation Process

First, the substrate 11 is prepared through forming the TFT layer 112 on the base member 111 (step S1 in FIG. 4). The TFT layer 112 can be formed through a publicly known TFT manufacturing method.

The interlayer insulating layer 12 is formed on the TFT layer 112. Specifically, a photosensitive resin material having a certain level of fluidity is applied through, for example, die coating along an upper surface of the substrate 11 such that unevenness on the substrate 11 due to the TFT layer 112 is compensated for. Due to this, the upper surface of the interlayer insulating layer 12 has a shape planarized along an upper surface of the base member 111.

Further, portions of the interlayer insulating layer 12 on, for example, the source electrodes of the TFT elements are dry-etched to form the contact holes (not illustrated). The contact holes are formed through patterning or the like such that surfaces of the source electrodes are exposed at bottom portions of the contact holes.

Next, the connection electrode layers are formed along inner walls of the contact holes. Upper portions of the connection electrode layers are partially over the interlayer insulating layer 12. The connection electrode layers can be formed through, for example, sputtering. Specifically, the connection electrode layers are formed through forming a metal film and patterning the metal film by photolithography and wet-etching.

(2) Pixel Electrodes Forming Process

Next, the pixel electrodes 13 are formed on the interlayer insulating layer 12 (step S3 in FIG. 4). The pixel electrodes 13 are formed through: (i) forming a pixel electrode material layer on the interlayer insulating layer 12 through, for example, vacuum vapor deposition, sputtering, or the like; and (ii) subsequently patterning the pixel electrode material layer through etching to form the pixel electrodes 13, which are divided to correspond one-to-one with the subpixels.

(3) Banks and Pixel Regulation Layers Forming Process

Next, the banks 14 and the pixel regulation layers 141 are formed (step S3 in FIG. 4).

In the present embodiment, the banks 14 and the pixel regulation layers 141 are formed at the same time by using a halftone mask as described below.

First, a bank material layer is formed through applying a resin material by the film thickness of the banks 14 on the interlayer insulating layer 12 on which the pixel electrodes 13 are formed. Specifically, the resin material can be applied through a wet process such as die coating, slit coating, spin coating, or the like.

After application, for example, unnecessary solvents are removed through vacuum drying, low-temperature drying around 60° C. to 120° C. (prebaking) and the like, and the bank material layer is irradiated through a photomask (not illustrated).

For example, when the bank material layer has positive photosensitivity, portions in which the bank material layer 140 is to remain are shielded, and portions from which the bank material layer 140 is to be removed are irradiated.

In the present example, the pixel regulation layers 141 have a smaller film thickness than the banks 14, and therefore portions of the bank material layer 140 in which the pixel regulation layers 141 are to be formed are subjected to half-exposure.

Accordingly, the photomask used in the exposure process has light-shielding portions that are placed at positions corresponding to the banks 14 and completely shield light, semi-transparent portions that are placed at positions corresponding to the pixel regulation layers 141, and light-transmissive portions that are placed at positions corresponding to portions in which the pixel electrodes 13 are exposed.

The light-transmittance of the semi-transparent portions is determined such that the bank material layer on the pixel electrodes 13 is subjected to full-exposure and the bank material layer on the pixel regulation layers 141 is subjected to half-exposure such that the bank material layer remains by the height of the pixel regulation layers 141 when the bank material layer is irradiated for a defined time period.

Next, through performing developing to remove regions of the bank material layer 140 that have been irradiated, the banks 14 and the pixel regulation layers 141, which have a smaller film thickness than the banks 14, are formed. Specifically, the developing is performed through, for example, dipping an entirety of the substrate 11 into a development solution such as an organic solvent, an alkali liquid, or the like that dissolves portions of the bank material layer 140 that have been irradiated and subsequently washing the substrate 11 by using a rinse liquid such as pure water or the like.

Due to this, the banks 14 extending in the Y direction and the pixel regulation layers 141 extending in the X direction are formed on the interlayer insulating layer 12.

(4) Light-Emitting Layers Forming Process

Next, the light-emitting layers 15 are formed above the pixel electrodes 13 described above (step S4 in FIG. 4).

Specifically, into openings that are each sandwiched by a pair of the banks 14, ink including a light-emitting material of a corresponding light-emission color is sequentially discharged from a nozzle of an application head of a printing device to apply the ink onto the pixel electrodes 13 in the openings. Here, the ink is applied continuously above the pixel regulation layers 141. Due to this, the ink can flow along the Y direction. This structure helps to reduce application unevenness of the ink and unify the film thickness of the light-emitting layer 15 in the same subpixel array.

Then, the substrate 11 after ink application is conveyed into a vacuum drying chamber and is heated in a vacuum environment to volatilize the organic solvent in the ink. Due to this, the light-emitting layers 15 are formed.

(5) Electron Transport Layer Forming Process

Next, the electron transport layer 16 is formed on the light-emitting layers 15 and the banks 14 (step S5 in FIG. 4) through, for example, vapor deposition such that the electron transport layer 16 spans over the subpixels.

(6) Common Electrode (Counter Electrode) Forming Process

Next, the common electrode 17 is formed on the electron transport layer 16 (step S7 in FIG. 4). In the present embodiment, the common electrode 17 is formed through forming a film of silver, aluminum, or the like through sputtering or vacuum vapor deposition.

(7) Protection Layer Forming Process

Next, the protection layer 18 is formed on the common electrode 17 (step S10 in FIG. 4).

Figure 5A:
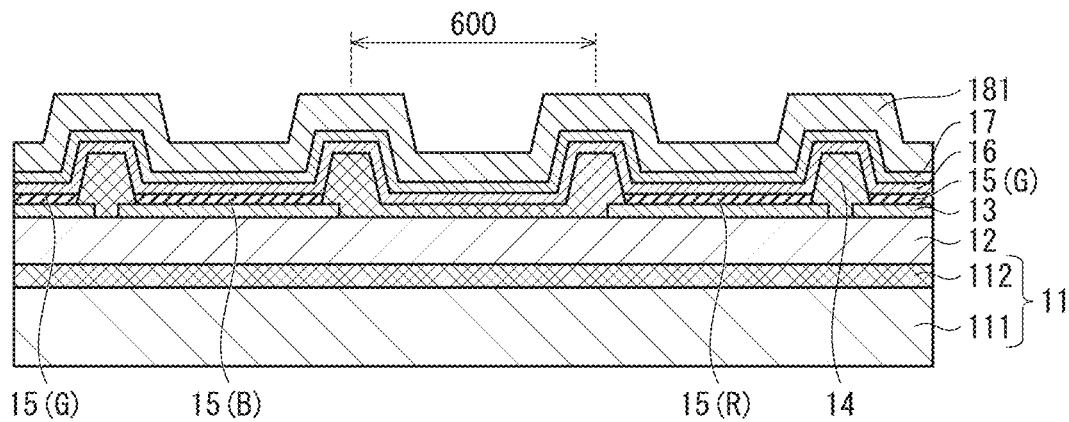
FIG. 5A, FIG. 5B, and FIG. 5C are each a partial cross-sectional diagram schematically illustrating a part of processes of manufacturing organic EL elements pertaining to at least one embodiment.

First, the first protection sublayer 181, which is made of SiN, is formed through, for example, plasma-enhanced chemical vapor deposition (PECVD) (FIG. 5A).

For example, silane ($SiH_4$) and ammonia ($NH_3$) are used as gas for forming the first protection sublayer 181. Nitrogen ($N_2$) may additionally be used.

Figure 5B:
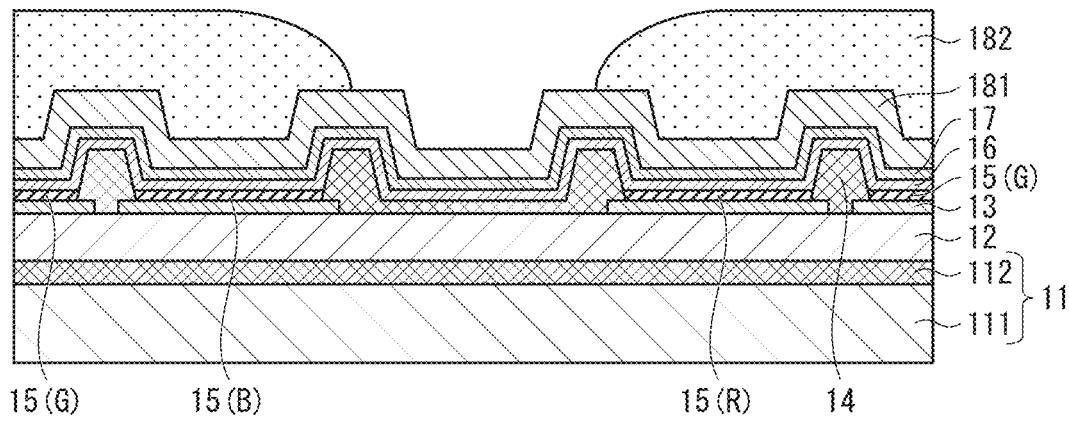

Next, the second protection sublayers 182 are formed through discharging a resin material from a nozzle of a head unit of a printing device onto the first protection sublayer 181 (FIG. 5B). Here, the resin material is applied separately by the printing device such that the resin material would not flow into the auxiliary electrode forming regions 600 (auxiliary regions). Note that the second protection sublayers 182 are not formed in the regions surrounding the organic EL display panel 10, either.

Here, portions of the banks 14 at the sides of the auxiliary electrode forming regions 600 in the X direction function as, so to speak, dams that prevent the resin material from flowing into the auxiliary electrode forming regions 600.

Then, the resin material is cured. For example, the resin material is cured through heating when the resin material has a thermosetting property; alternatively, the resin material is cured through ultraviolet irradiation when the resin material has an ultraviolet-curing property. Note that the resin material can be applied through screen printing, dispensing, or the like.

Figure 5C:
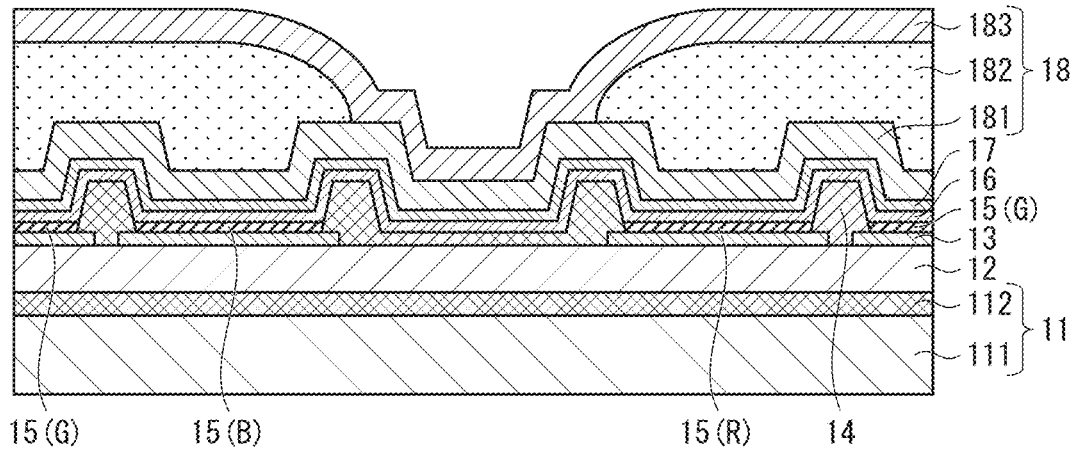

Then, the third protection sublayer 183 is formed on the second protection sublayers 182 by using the same film-forming conditions as the first protection sublayer 181. However, the second protection sublayers 182 are not present in the auxiliary electrode forming regions 600 and the regions surrounding the organic EL display panel 10 as described above, and therefore the third protection sublayer 183 is laminated directly on the first protection sublayer 181 (FIG. 5C). Due to this, the resin of the second protection sublayers 182 would not be exposed to the outside. Accordingly, moisture or the like in the air would not penetrate into the second protection sublayers 182 easily, and a film thickness of the protection layer 18 in the auxiliary electrode forming regions 600 can be made much smaller than in the conventional technology.

The organic EL element 2 is not present in the auxiliary electrode forming regions 600, and therefore deterioration of the organic EL elements 2 would not occur easily even when the protection layer 18 does not have a three-layered structure as in the light-emitting regions 500.

(8) Contact Openings Forming Process

Next, contact openings 20 (in the present embodiment, the contact openings are formed to have a groove shape, and therefore such contact openings and standard contact holes as penetrating holes are collectively referred to as "contact openings") for forming the auxiliary electrodes 19 are formed within the auxiliary electrode forming regions 600 in the protection layer 18 (step S8).

As described above, the second protection sublayers 182 are not formed in the auxiliary electrode forming regions 600, and the first protection sublayer 181 and the third protection sublayer 183 are directly laminated with each other. Thus, the film thicknesses in the auxiliary electrode forming regions 600 can be made much thinner (around 500 nm to 2000 nm) than in the structure in FIG. 18. Accordingly, the contact openings 20 can be formed easily through etching.

For example, the contact openings 20 are formed through the following processes.

Figure 6A:
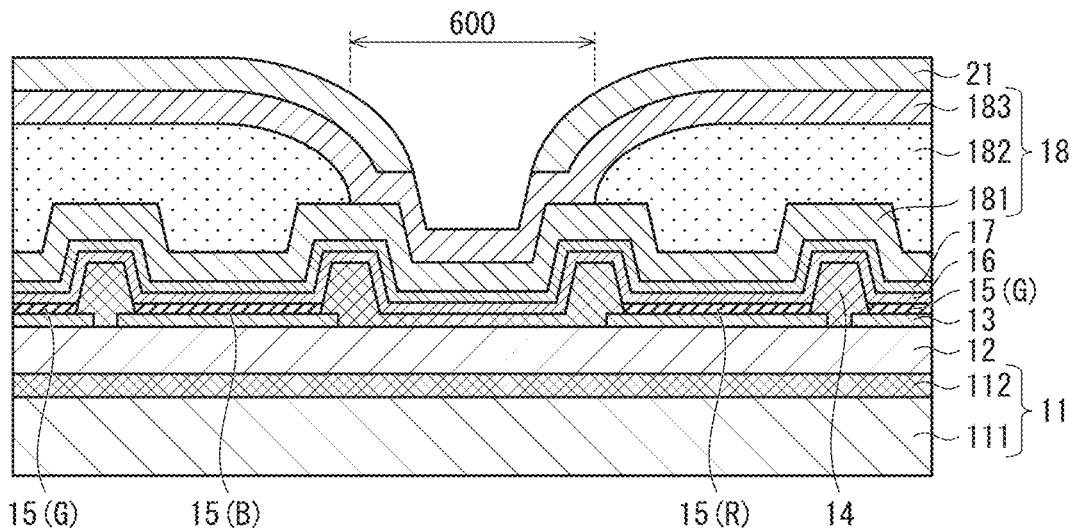
FIG. 6A, FIG. 6B, and FIG. 6C are each a partial cross-sectional diagram schematically illustrating a part of processes of manufacturing the organic EL elements pertaining to at least one embodiment, continuing from FIG. 5C.

(A) First, a resist 21 made of a photosensitive resin is formed on the third protection sublayer 183, and the resist 21 is patterned through photolithography such that portions corresponding to positions at which the contact openings 20 (see FIG. 6B) are to be formed are opened (FIG. 6A).

Figure 6B:
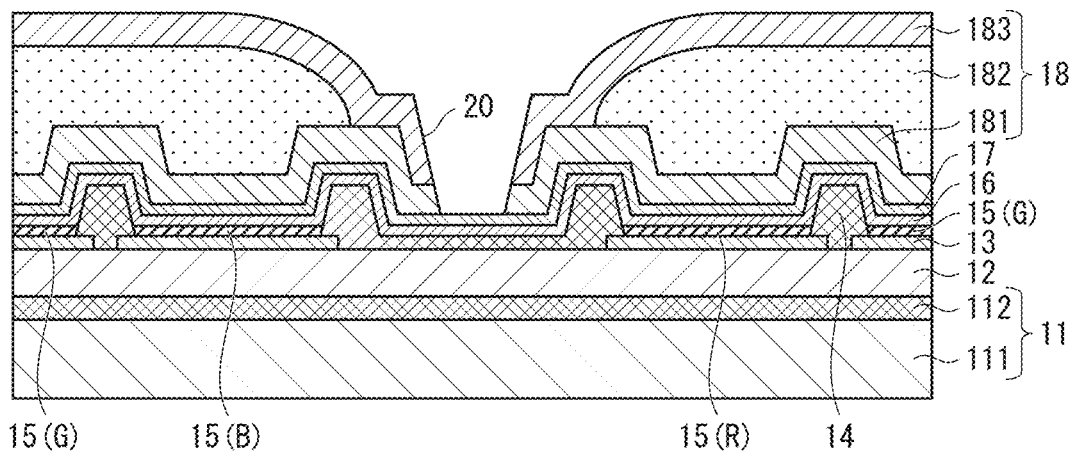
Figure 6C:
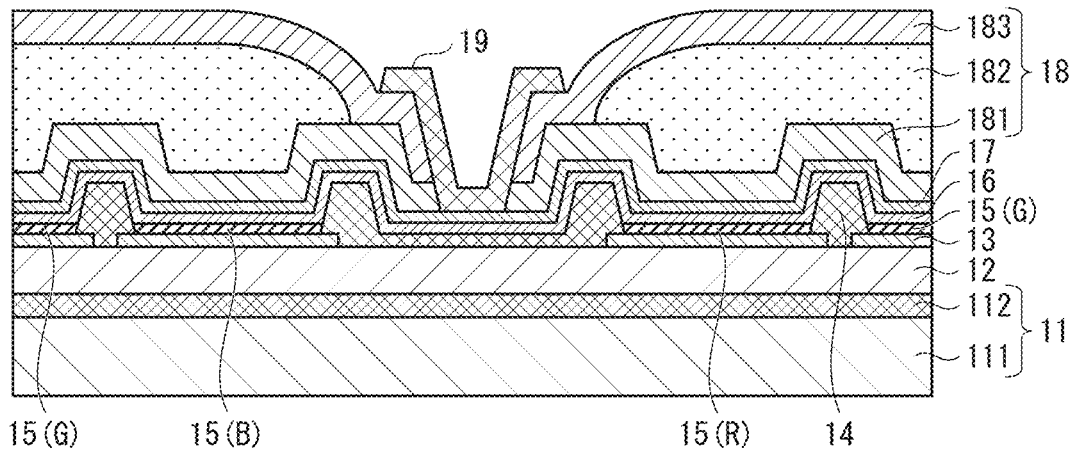

(B) Next, the contact openings 20 for forming the auxiliary electrodes 19 are formed in the first protection sublayer 181 and the third protection sublayer 183 through dry-etching such that a surface of the common electrode 17 is exposed (FIG. 6B).

The resist 21 does not have a great resistance against etching. Accordingly, during the dry-etching, inner circumferential portions of the openings in the resist 21 are slightly corroded and the diameters of the openings gradually become large, and therefore inner side surfaces of the contact openings 20 after forming have a tapered shape that has a greater diameter toward their upper portions. Further, etching is performed within a short time period and therefore hardly any side etching occurs.

(C) The resist 21 is removed through a wet process and washed by using a rinse liquid.

In the present embodiment, the contact openings are each formed in a shape of a groove extending in a column direction (Y direction in FIG. 2), but a plurality of contact holes may be arrayed at defined intervals in the column direction.

(9) Auxiliary Electrodes Forming Process

Next, the auxiliary electrodes 19 are formed (step S9 in FIG. 4).

The auxiliary electrodes 19 are formed through forming a metal layer on the protection layer 18 in the state of FIG. 6B and patterning the metal layer through photolithography.

For example, the auxiliary electrodes 19 are formed through the following processes.

(A) The metal layer is formed through sputtering or vacuum vapor deposition such that an upper surface of the protection layer 18 is covered by the metal layer.

(B) On the metal layer, a resist mask that is patterned to mask portions in which the auxiliary electrodes 19 are to be formed is formed through photolithography.

(C) Portions of the metal layer excluding portions of the metal layer that are masked are removed through wet-etching or dry-etching, the remaining resist mask is removed through a wet process (resist peeling), and washing is performed by using a rinse liquid.

Due to this, the auxiliary electrodes 19 are formed (FIG. 6C), and the organic EL display panel 10 is completed.

Note that the above-described manufacturing method is a mere example and can be appropriately changed.

As described above, the contact openings 20 each have a tapered shape and have good surface states. Accordingly, the contact openings 20 have good coverage when forming the metal layer, and the auxiliary electrodes 19 after completion have a small electrical resistance. This helps to suppress voltage decline of the common electrode 17 and to display high-quality images without luminance unevenness.

Note that the auxiliary electrodes 19 need not be formed in all the auxiliary electrode forming regions 600; the effect of suppressing voltage decline of the common electrode 17 is obtained even when the auxiliary electrodes 19 are formed in some of the auxiliary electrode forming regions 600 at defined intervals. In such a case, the second protection sublayers 182 are not formed and the first protection sublayer 181 and the third protection sublayer 183 are directly laminated with each other in, among the plurality of auxiliary electrode forming regions 600 (non-light-emitting portions), ones of the auxiliary electrode forming regions 600 in each of which an auxiliary electrode 19 is disposed.

4. Effects

The embodiment described above has the following effects.

(1) In the light-emitting regions of the organic EL display panel 10, the protection layer 18 has a three-layered structure in which the first protection sublayer 181 and the third protection sublayer 183, which are made of an inorganic material that does not allow liquids such as moisture to penetrate easily, sandwich the second protection sublayers 182 made of a resin material. Due to this, the protection layer 18 has a sufficient thickness, and even when a minute impurity exists on the common electrode 17, such an impurity is sufficiently covered. Further, the second protection sublayers 182 are made of a resin material, and therefore the second protection sublayers 182 absorb shocks from the outside and suppress occurrence of cracks in the protection layer 18.

(2) Further, in the auxiliary electrode forming regions 600, the first protection sublayer 181 and the third protection sublayer 183 are directly laminated with each other without the second protection sublayers 182 disposed therebetween, and therefore the protection layer 18 has a small film thickness in portions having such a structure. Due to this, the contact openings 20 can be formed easily and the task time can be shortened. Further, side etching would not occur on inner surfaces of the contact openings 20, and therefore the auxiliary electrodes 19 that are subsequently formed have good film-forming states, and have electrical conductivity great enough to suppress voltage decline of the common electrode 17.

(3) Because the task time is shortened, a typical photosensitive resin can be used for the etching mask, and this is beneficial from the perspective of costs. Further, the inner side surfaces of the contact openings 20 can be formed in a tapered shape that is wider in their upper portions, the film-forming properties and coverage of the auxiliary electrodes 19 are further improved, and therefore good electrical conductivity of the auxiliary electrodes 19 is ensured.

Other Embodiments

An organic EL display panel and a method of manufacturing the organic EL display panel have each been described as at least one embodiment of the present disclosure, but the present disclosure is not limited to the description above, except for essential characteristic elements thereof. The following describes modifications that exemplify other embodiments of the present disclosure.

1. Modification of Contact Openings Forming Process

In at least one embodiment, in the contact openings forming process in step S8 in FIG. 4, the resist 21 made of a photosensitive resin is formed on the third protection sublayer 183, the resist 21 is patterned, and the resist 21 after patterning is dry-etched to form the contact openings 20. However, a so-called hard mask 22 such as an ITO film or the like may be formed instead of the resist 21. FIG. 7 is a schematic cross-sectional diagram of the contact openings forming process in such a modification.

Figure 7A:
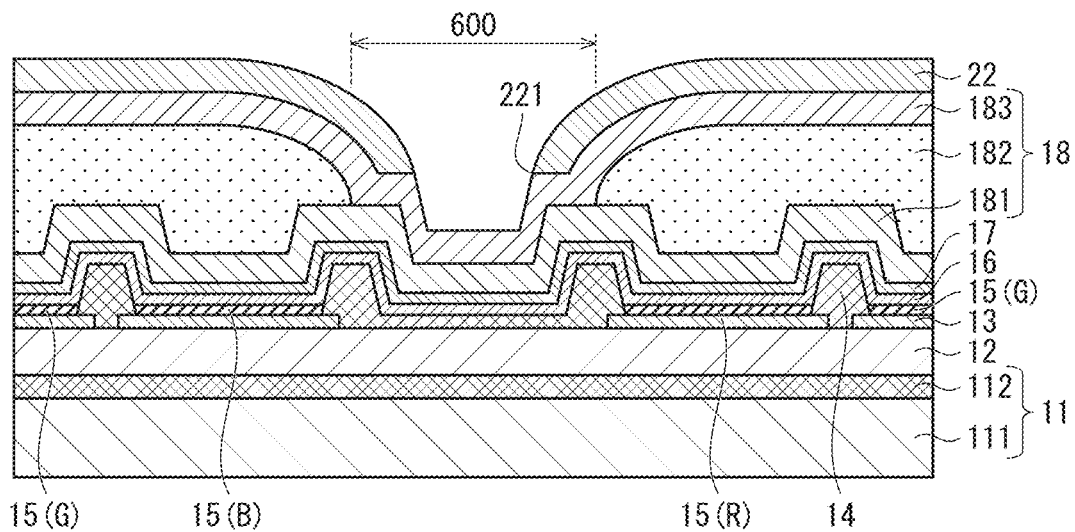
FIG. 7A, FIG. 7B, and FIG. 7C are each a partial cross-sectional diagram schematically illustrating a part of processes of manufacturing contact openings in organic EL elements pertaining to at least one embodiment.

First, the hard mask 22 is formed on the third protection sublayer 183, which is the uppermost layer in the protection layer 18, and the hard mask 22 is patterned through photolithography to form openings 221 at positions in which the contact openings are to be formed (FIG. 7A).

Figure 7B:
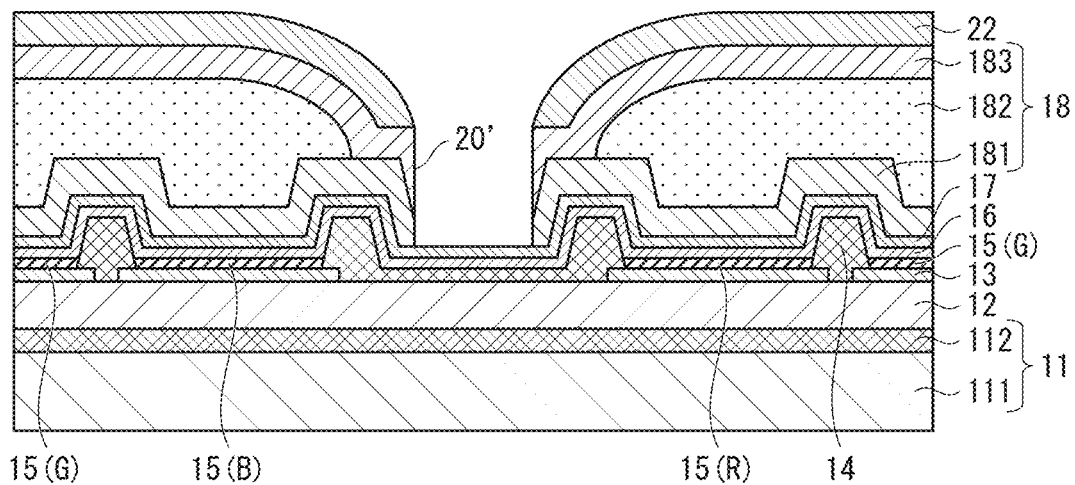

Next, the first protection sublayer 181 and the third protection sublayer 183 are dry-etched through the hard mask 22 to form contact openings 20' (FIG. 7B).

The hard mask 22 has a great resistance against etching, and therefore tapers are not formed in the contact openings 20' as in FIG. 6B in which the resist 21 is used. However, a total film thickness of the first protection sublayer 181 and the third protection sublayer 183 is much smaller than in the conventional technology, and therefore etching can be performed within a short time period, and side etching does not occur on inner side surfaces of the contact openings 20'.

Figure 7C:
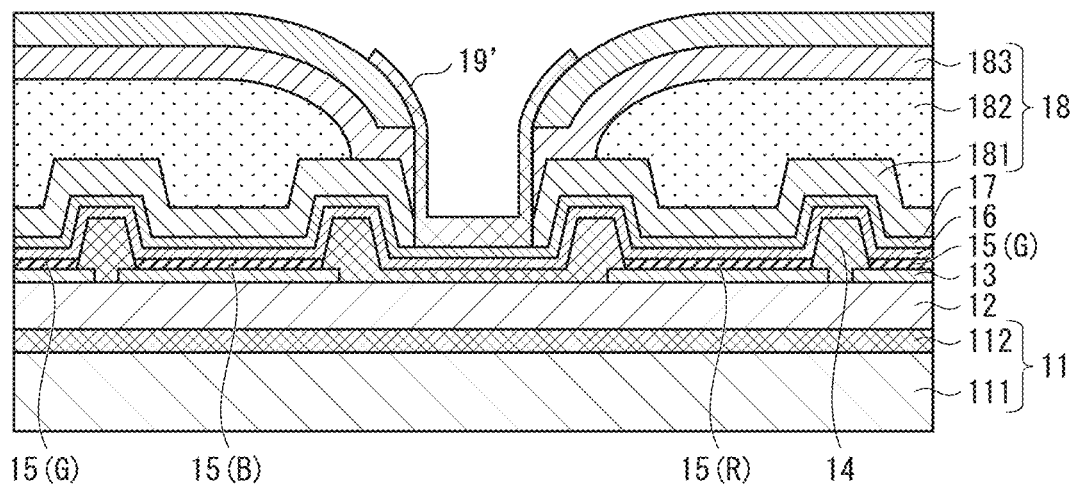

Then, a metal layer is formed through vapor deposition or sputtering and the metal layer is patterned to form auxiliary electrodes 19' as in FIG. 7C. Because side etching does not occur in the contact openings 20', the auxiliary electrodes 19' have relatively uniform film thicknesses and have electrical conductivity great enough to suppress voltage decline.

According to this modification, the hard mask 22 is a transparent film of ITO or the like. Thus, the hard mask 22 does not have to be removed after forming the openings 20', and the number of processes can be reduced accordingly.

2. Modification of Partition Structure of Auxiliary Electrode Forming Regions 600

In at least one embodiment, each of the auxiliary electrode forming regions 600 is formed through partitioning the sides of the auxiliary electrode forming region 600 by the banks 14 in the light-emitting regions 500.

However, the second protection sublayers 182 of the protection layer 18 are formed through applying a resin having a relatively great fluidity by using a printing device, and therefore may flow into the auxiliary electrode forming regions 600 in some cases.

Figure 9A:
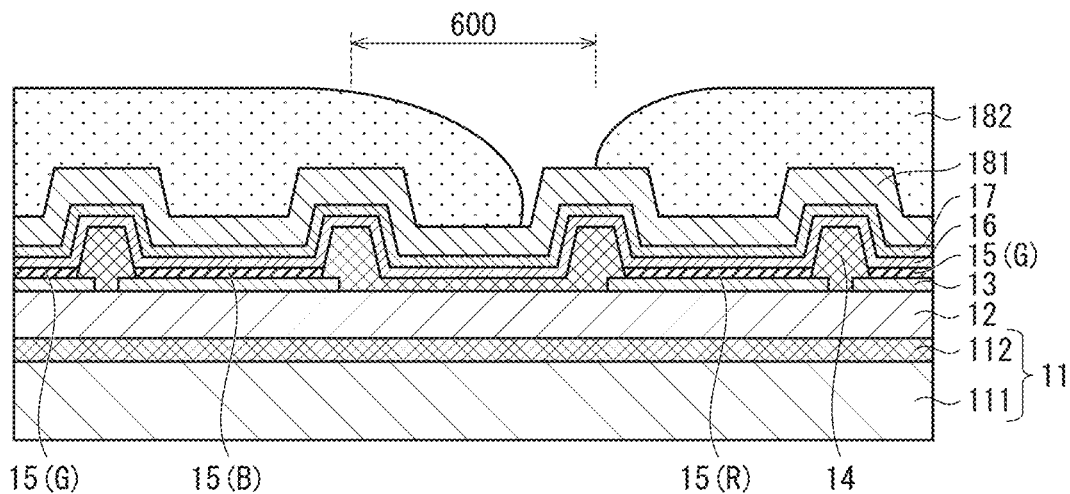
FIG. 9A and FIG. 9B are schematic cross-sectional diagrams illustrating risks that may occur when dam banks in FIG. 8A and FIG. 8B pertaining to at least one embodiment are not present.
Figure 9B:
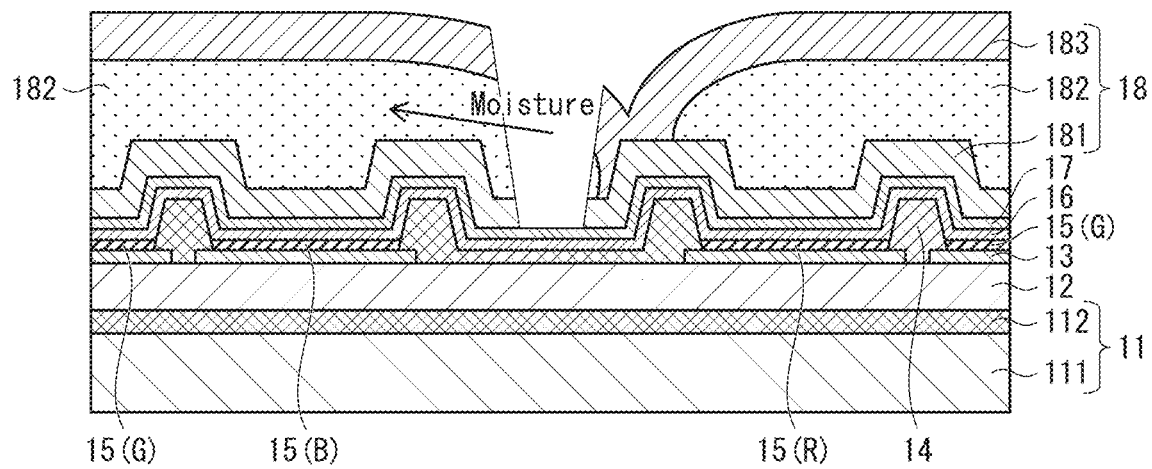

FIG. 9A and FIG. 9B are schematic cross-sectional diagrams illustrating such a case.

The resin material immediately after application has a great fluidity. Accordingly, when the application position is slightly aside from the target application position or the dropping amount is slightly greater than the desired dropping amount, the resin material goes over the banks 14 and flows into the auxiliary electrode forming regions 600 as in FIG. 9A.

In such cases, the protection layer 18 has a great film thickness in portions where the contact openings 20 are to be formed, and after etching, the resin of the second protection sublayers 182 are exposed in the contact openings 20 as in FIG. 9B. During the wet process for removing the resist 21 and the like that are subsequently performed, liquids penetrate from the portions of the contact openings 20 in which the resin of the second protection sublayers 182 is exposed, and the aim of the protection layer 18 cannot be fully achieved.

Figure 8A:
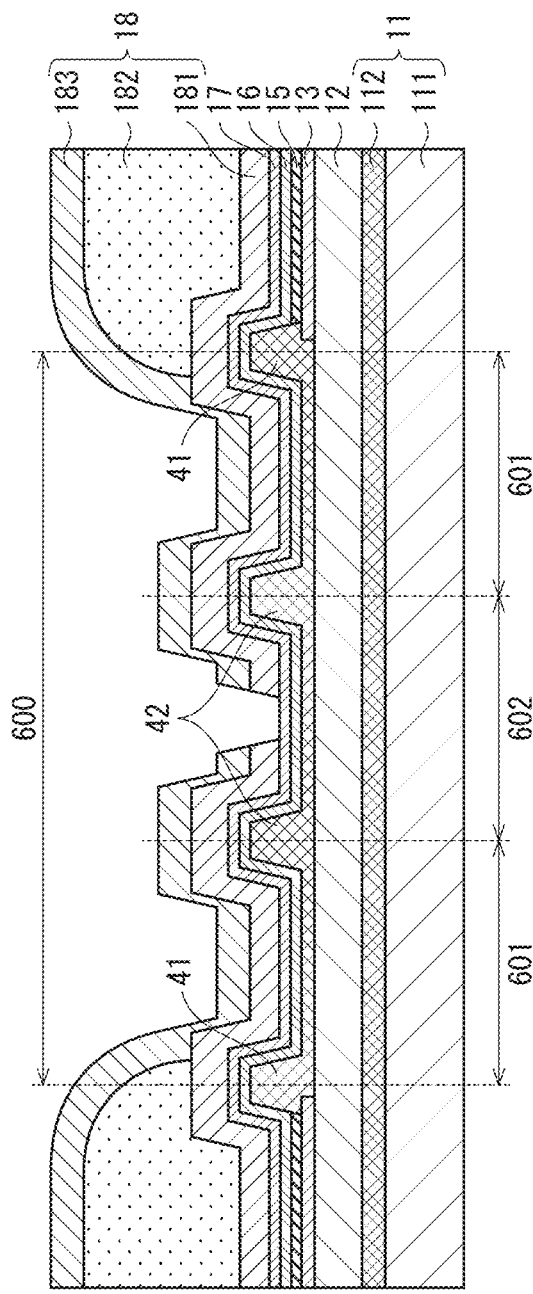
FIG. 8A and FIG. 8B are schematic cross-sectional diagrams illustrating a partition structure of auxiliary electrode forming regions pertaining to at least one embodiment.
Figure 8B:
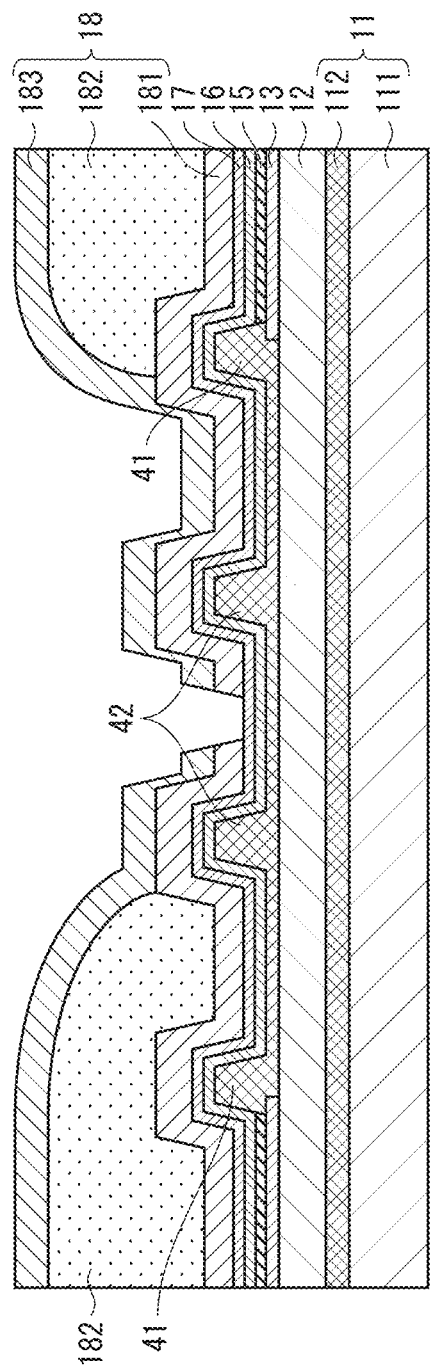

FIG. 8A and FIG. 8B are schematic cross-sectional diagrams of an organic EL display panel 10 pertaining to a first modification of the auxiliary electrode forming regions for overcoming such a problem.

As in FIG. 8A, in the present modification, banks (dam banks) 42 provided specifically for preventing the organic material of the second protection sublayers 182 from flowing are disposed inside banks that each form a boundary between an auxiliary electrode forming region 600 and a light-emitting region 500 (hereinafter referred to as "boundary banks 41"). Consequently, regions into which the organic material can flow (flow margin region) 601 are formed between the boundary banks 41 (first partition walls) and the dam banks 42 (second partition walls), and regions each partitioned by a pair of dam banks 42 serve as actual auxiliary electrode forming regions 602.

Due to this, even when the resin material of the second protection sublayers 182 goes over the boundary banks 41 during forming, the resin material is dammed by the dam banks 42 and is prevented from flowing further inside (see FIG. 8B).

Figure 10:
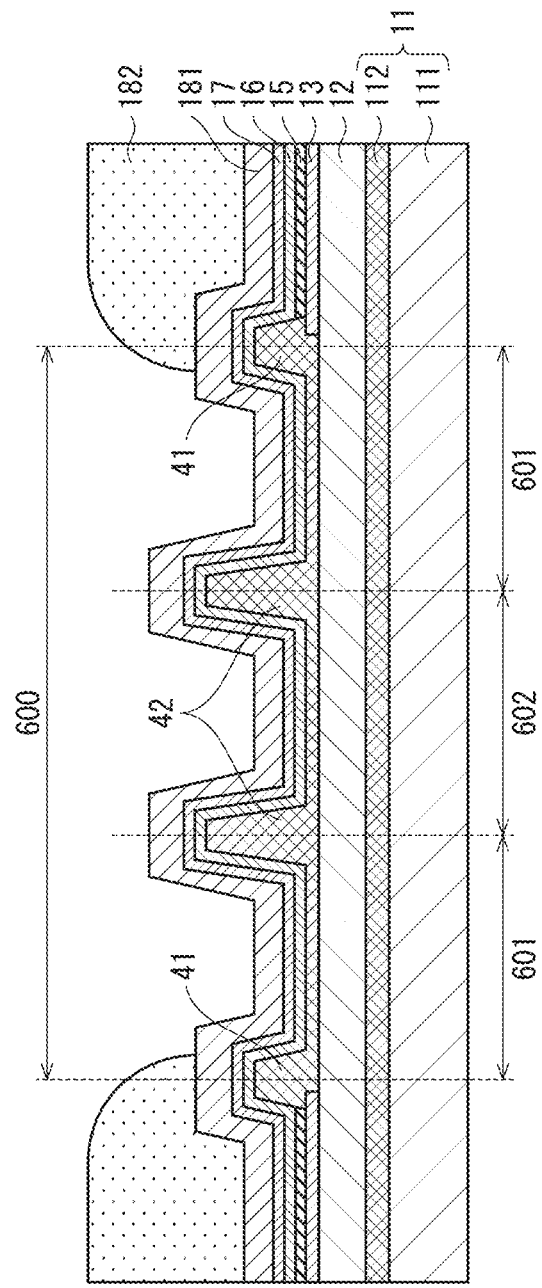
FIG. 10 is a schematic cross-sectional diagram illustrating a partition structure of auxiliary electrode forming regions pertaining to at least one embodiment.

FIG. 10 is a schematic cross-sectional diagram of a second modification of a partition structure of the auxiliary electrode forming regions.

In FIG. 10, the dam banks 42 have a greater height than the boundary banks 41. This structure helps to further ensure prevention of flowing of the resin material when forming the second protection sublayers 182.

Figure 11:
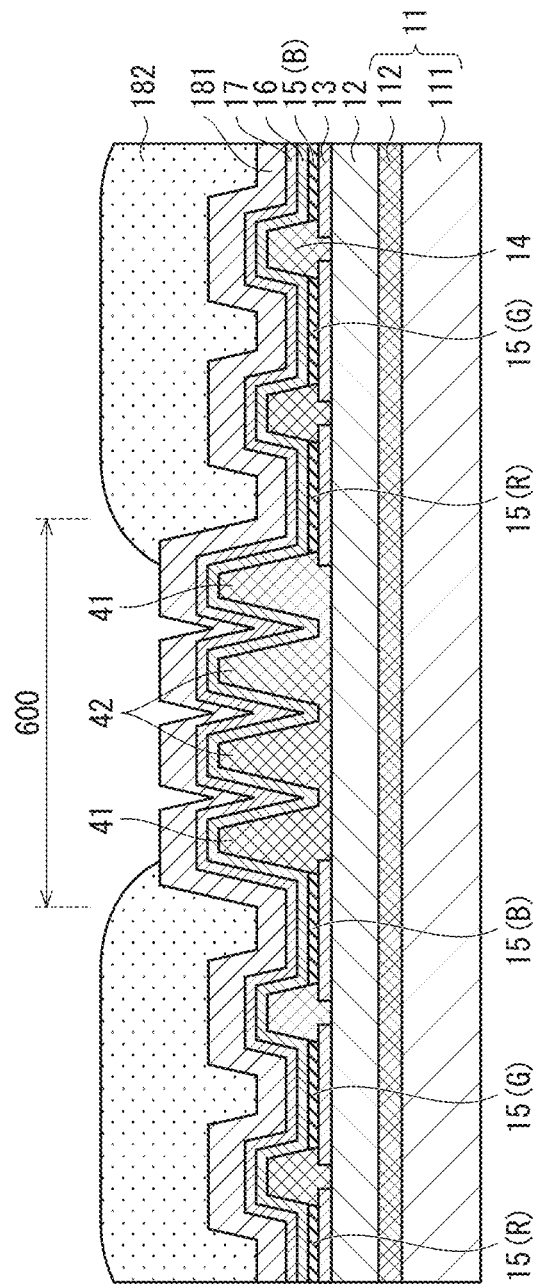
FIG. 11 is a schematic cross-sectional diagram illustrating a partition structure of auxiliary electrode forming regions pertaining to at least one embodiment.

FIG. 11 is a schematic cross-sectional diagram of a third modification of the partition structure of the auxiliary electrode forming regions.

In the present modification, the boundary banks 41 are as high as the dam banks 42. This structure helps to further ensure prevention of flowing of the resin material.

Figure 12:
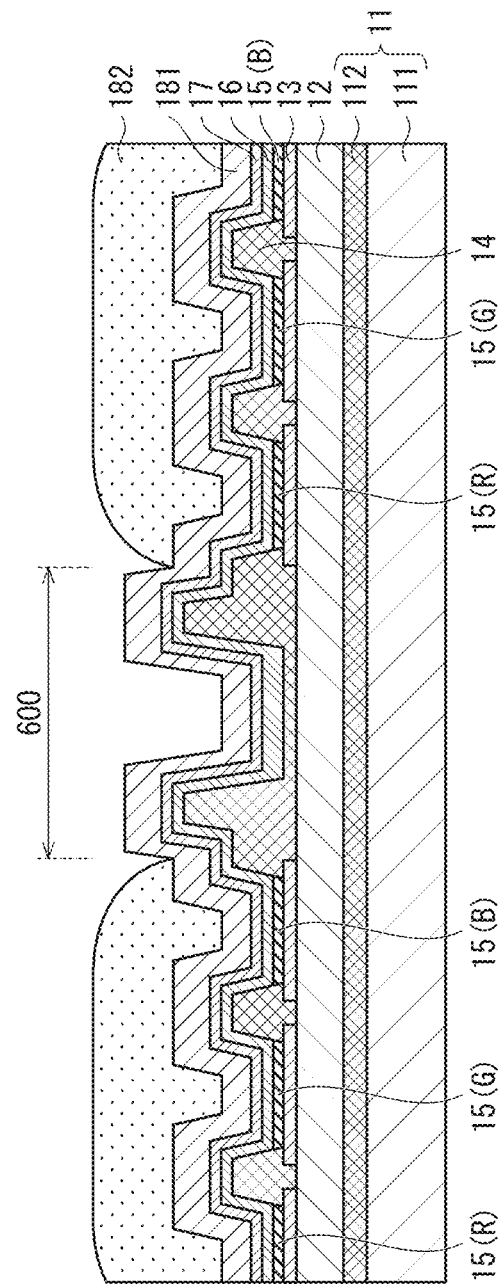
FIG. 12 is a schematic cross-sectional diagram illustrating a partition structure of auxiliary electrode forming regions pertaining to at least one embodiment.

FIG. 12 is a schematic cross-sectional diagram of a fourth modification of the partition structure of the auxiliary electrode forming regions.

In the present modification, the boundary banks 41 have a greater width than the above embodiment to form a step portion such that the boundary banks 41 have greater heights toward the auxiliary electrode forming regions 600 than toward the light-emitting regions 500; that is, the boundary banks 41 each have a shape such that the dam bank 42 in FIG. 10 is integrated with the boundary bank 41 in FIG. 10.

Figure 13:
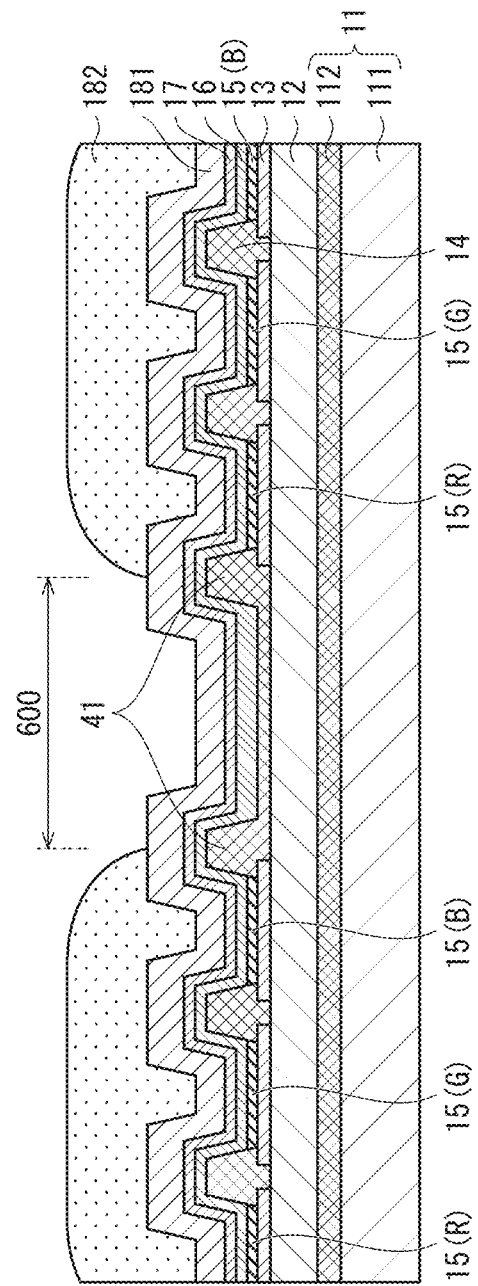
FIG. 13 is a schematic cross-sectional diagram illustrating a partition structure of auxiliary electrode forming regions pertaining to at least one embodiment.
Figure 14:
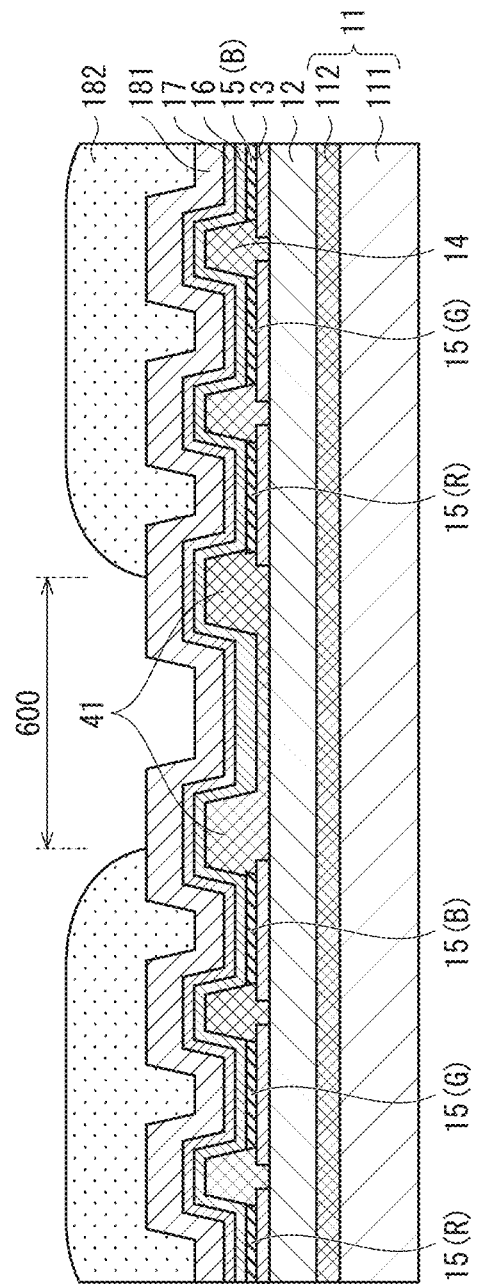
FIG. 14 is a schematic cross-sectional diagram illustrating a partition structure of auxiliary electrode forming regions pertaining to at least one embodiment.

FIG. 13 is a diagram of a fifth modification in which the widths of the boundary banks 41 are the same as the above embodiment and a distance between each pair of adjacent ones of the boundary banks 41 in the auxiliary electrode forming regions 600 is greater than a distance between each pair of adjacent ones of the banks 14 in the light-emitting portions 500. FIG. 14 is a diagram of a sixth modification in which the boundary banks 41 have a greater width than other banks 14.

These structures help to suppress the organic resin flowing to positions at which the contact openings 20 for the auxiliary electrodes 19 are actually formed (centers of each pair of the boundary banks 41) more easily.

3. Modification of Shapes of Second Protection Sublayers 182

Figure 15:
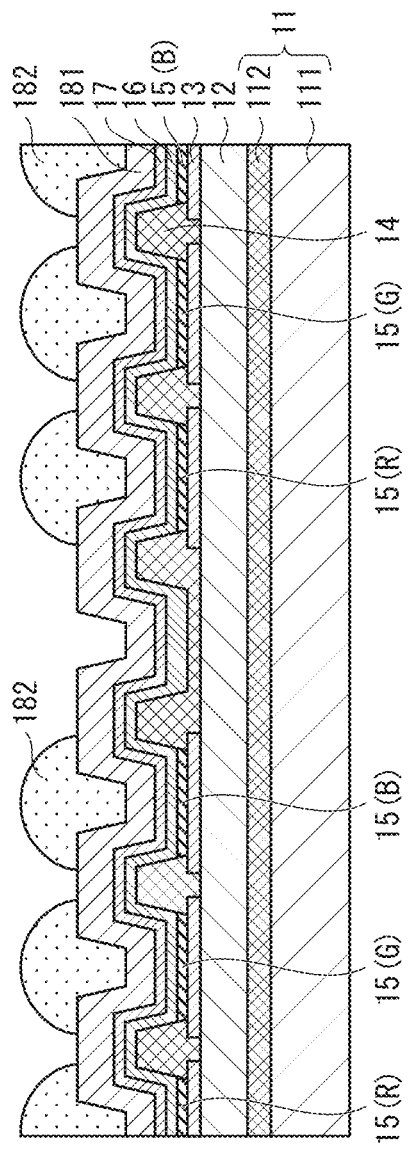
FIG. 15 is a schematic cross-sectional diagram illustrating second protection sublayers in a protection layer pertaining to at least one embodiment.

In at least one embodiment, the second protection sublayers 182 cover an entirety of the light-emitting regions 500 excluding the auxiliary electrode forming regions 600 and the and regions surrounding the organic EL display panel 10, respectively. However, from the perspective of protection of, specifically, the organic layers in the organic EL elements, the second protection sublayers 182 may be disposed only at positions that are above the light-emitting layers 15 and that span over the banks 14 as in FIG. 15.

4. Modification in which Protection Layer 18 does not Include First Protection Sublayer 181

Figure 16:
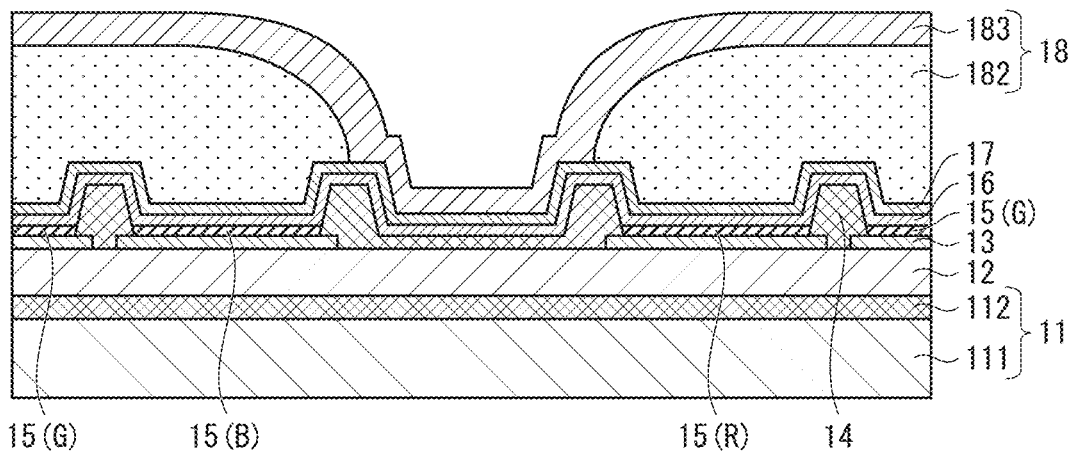
FIG. 16 is a schematic cross-sectional diagram illustrating at least one embodiment in a case where the protection layer does not include a first protection sublayer.

Further, the protection layer 18 need not necessarily include the first protection sublayer 181. A structure including the second protection sublayers 182 (first protection layer) and the third protection sublayer 183 (second protection layer) as in FIG. 16 can play the role of preventing absorption of liquids to the inside and oxidization and alternation of the components of the organic EL elements due to contact with external air to some extent. Further, in such a case, only the third protection sublayer 183 is disposed above the common electrode 17 in the auxiliary electrode forming regions, and therefore the contact openings 20 can be formed more easily and the task time can be further shortened.

5. Modification in which Second Auxiliary Electrodes are Disposed Below Electron Transport Layer 16

Figure 17:
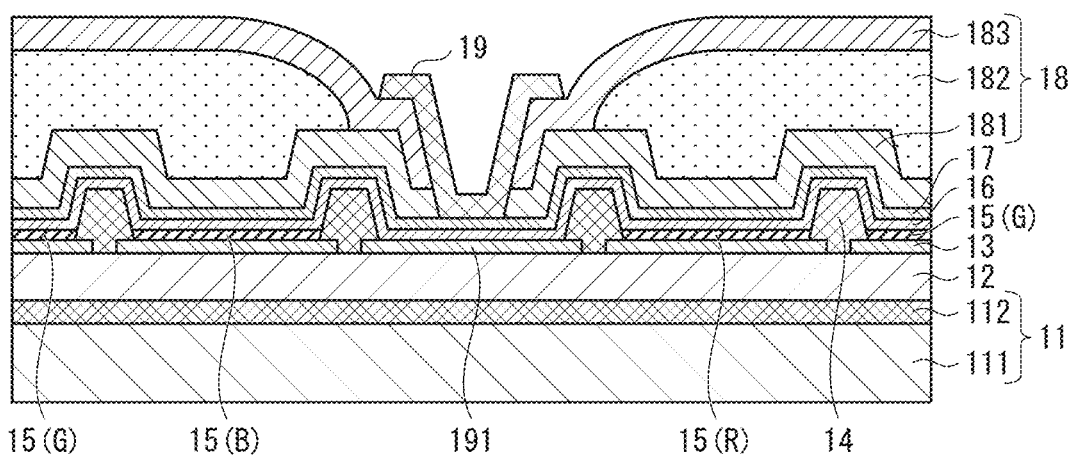
FIG. 17 is a schematic cross-sectional diagram illustrating at least one embodiment in a case where second auxiliary electrodes are disposed below an electron transport layer.

FIG. 17 is a schematic cross-sectional diagram of a structure in which second auxiliary electrodes 191 are disposed below the electron transport layer 16 independently from the auxiliary electrodes (first auxiliary electrodes) 19.

The second auxiliary electrodes 191 may be formed simultaneously with the pixel electrodes 13 when patterning the pixel electrode material layer formed on the interlayer insulating layer 12 during the pixel electrodes forming process.

The electron transport layer 16 typically does not have great electrical conductivity, and therefore the second auxiliary electrodes help prevention of voltage decline in the common electrode 17 to some extent, although not as greatly as the auxiliary electrodes 19 that are in direct contact with the common electrode 17.

6. Other Modifications (1) In at least one embodiment, the light-emitting layers 15(R) including a light-emitting material emitting light of the color corresponding to the subpixels of R, the light-emitting layers 15(G) including a light-emitting material emitting light of the color corresponding to the subpixels of G, and the light-emitting layers 15(B) including a light-emitting material emitting light of the color corresponding to the subpixels of B are formed to form the organic EL display panel 10 displaying full-color images. However, a structure in which the light-emitting layers all emit white light and a publicly known color filter substrate including filters of R, G, and B is joined above the protection layer 18 through transparent adhesive or the like is possible.

(2) In at least one embodiment, the light-emitting layers are formed through a wet process, but the present disclosure should not be construed as being limited to this. For example, a dry process can be used such as vacuum vapor deposition, electron beam deposition, sputtering, reactive sputtering, ion plating, a vapor phase growth process, or the like.

(3) In at least one embodiment, the film-forming conditions and composition of the first protection sublayer 181 and the film-forming conditions and composition of the third protection sublayer 183 are the same. However, they need not necessarily be exactly the same, and may be appropriately changed by a skilled artisan.

Further, inorganic materials typically have a lower moisture absorbing property than resins, and therefore another appropriate inorganic material (such as silicon oxynitride (SiON), silicon carbide (SiC), or the like) may be used for a material of the first protection sublayer 181 and the third protection sublayer 183 instead of or in addition to silicon nitride (SiN) described above.

(4) In at least one embodiment, the organic EL elements each include a pixel electrode, a light-emitting layer, an electron transport layer, and a common electrode. However, the organic EL elements may each include, between the pixel electrode and the light-emitting layer, a hole injection layer and/or a hole transport layer. Further, the organic EL elements may include, between the electron transport layer and the common electrode, an electron injection layer.

(5) In at least one embodiment, the banks 14 and the pixel regulation layers 141 having heights differing from each other are formed simultaneously in a single process with use of a halftone mask, but the banks 14 and the pixel regulation layers 141 may be formed in different processes.

For example, firstly, the pixel regulation layers 141 for partitioning the pixel electrode arrays in the Y direction are formed.

Specifically, the pixel regulation layers 141 are formed through, for example, applying a resin material by die coating or the like on the upper surface of the substrate 11 on which the pixel electrodes have been formed. Next, through patterning the resin material by using photolithography and then baking, the pixel regulation layers 141 are formed between the pixel electrodes 13 that are adjacent in the Y direction.

Next, a bank resin that is a material of the banks 14 is uniformly applied through, for example, die coating to form a bank material layer, and the bank material layer is patterned through photolithography and then is baked to form the banks 14.

(6) In at least one embodiment, description is provided of an organic EL display panel employing the line bank structure, but an organic EL display panel employing a so-called pixel bank structure in which each of the subpixels has four sides surrounded by banks in the light-emitting regions 500 is possible.

(7) In the organic EL display panel 10 pertaining to at least one embodiment, the subpixels 100R emitting light of the color R, the subpixels 100G emitting light of the color G, and the subpixels 100B emitting light of the color B are arrayed, but the colors of light emitted from the subpixels should not be construed as being limited to this. For example, the subpixels may emit four colors of light of R, G, B, and yellow (Y). Further, in each of the pixels P, the number of subpixels per each color should not be construed as being limited to one, and the pixels P may each include a plurality of subpixels of the same color. Further, the order of the subpixels in the pixels P should not be construed as being limited to the order of R, G, and B in FIG. 2, and the order may be rearranged.

(8) In the organic EL display panel 10 pertaining to at least one embodiment, the pixel electrodes 13 are the anodes and the common electrode 17 is the cathode. However, the present disclosure should not be construed as being limited to this, and an inverted structure in which the pixel electrodes 13 are cathodes and the common electrode 17 is an anode is possible. The order in which the hole injection layer, the hole transport layer, the electron transport layer, the electron injection layer, and the like are laminated is appropriately adjusted in accordance with the positions of the cathode and the anode.

Note that the hole injection layer, the hole transport layer, the electron transport layer, the electron injection layer, and the like may be regarded as an "electric charge movement facilitating layer" that is a generic concept including these layers, taking into account functions of these layers.

(9) In at least one embodiment, the contact openings 20 are each formed in a shape of a groove in a direction parallel with the banks 14 (column direction). However, instead of such a structure, a plurality of contact holes (penetrating holes) may be provided linearly at appropriate pitches.

(10) Further, the organic EL display panel 10 pertaining to at least one embodiment is an active matrix type of panel. However, the organic EL display panel 10 should not be construed as being limited to this, and may be a passive matrix type of panel.

Although an organic EL display panel and a manufacturing method thereof pertaining to the present disclosure have been fully described by way of one or more embodiments and modifications with reference to the accompanying drawings, the present disclosure should not be construed as being limited to the above embodiments and modifications. Therefore, various changes and modifications that are apparent to a skilled artisan should be construed as being included therein unless such changes and modifications and one or more embodiments that are achieved through combining elements and functions of embodiments and modifications depart from the scope of the present disclosure.

The invention claimed is:

1. An organic electroluminescence (EL) display panel, comprising:
    a substrate;
    a plurality of first electrodes that are spaced away from each other and are arrayed in rows and columns above the substrate;
    a plurality of light-emitting layers that include organic light-emitting material and are disposed above the first electrodes;
    a second electrode that is disposed above the light-emitting layers;
    a first protection layer that includes resin and is disposed above the second electrode and is not disposed within an auxiliary region which, in plan view, extends in a column direction between ones of the first electrodes that are adjacent in a row direction across the substrate;
    a second protection layer that includes inorganic material and is disposed above the first protection layer and the second electrode; and
    an auxiliary electrode layer that extends in the column direction within the auxiliary region and is electrically connected to the second electrode through a contact opening in the first protection layer within the auxiliary region.

2. The organic EL display panel of claim 1, further comprising:
    partition walls, wherein
    in plan view of the substrate, the partition walls extend in the column direction and are disposed between the auxiliary region and regions where the light-emitting layers are disposed.

3. The organic EL display panel of claim 2, further comprising:
    second partition walls, wherein
    the partition walls are first partition walls, and
    in plan view of the substrate, the second partition walls extend in the column direction and are disposed between the first partition walls and the auxiliary electrode layer.

4. The organic EL display panel of claim 3, wherein
    the second partition walls have a greater height than the first partition walls.

5. The organic EL display panel of claim 4, further comprising:
    banks extending in the column direction and partitioning the organic light-emitting layers arrayed in the column direction, wherein
    the first partition walls and the second partition walls have greater heights than the banks.

6. The organic EL display panel of claim 3, further comprising:
    banks extending in the column direction and partitioning the organic light-emitting layers arrayed in the column direction, wherein
    the first partition walls and the second partition walls have greater heights than the banks.

7. The organic EL display panel of claim 2, further comprising:
    banks extending in the column direction and partitioning the organic light-emitting layers arrayed in the column direction, wherein
    the partition walls are ones of the banks that are closest to the auxiliary region.

8. The organic EL display panel of claim 7, wherein
    a width of the partition walls in the row direction is greater than a width of the banks, excluding the partition walls, in the row direction.

9. The organic EL display panel of claim 8, wherein
    a distance between the partition walls in the auxiliary region in the row direction is greater than a distance between each pair of adjacent ones of the banks, excluding the partition walls, in the row direction.

10. The organic EL display panel of claim 7, wherein
    a distance between the partition walls in the auxiliary region in the row direction is greater than a distance between each pair of adjacent ones of the banks, excluding the partition walls, in the row direction.

11. The organic EL display panel of claim 1, further comprising:
    an electric charge movement facilitating layer below the second electrode and above the light-emitting layers and the auxiliary region; and a second auxiliary electrode layer extending in the column direction and electrically contacting a surface of the electric charge movement facilitating layer opposite the second electrode within the auxiliary region, wherein the auxiliary electrode layer is referred to as a first auxiliary electrode layer.

12. The organic EL display panel of claim 11, wherein the second auxiliary electrode layer includes the same material as the first electrodes and is in the same layer as the first electrodes.

13. The organic EL display panel of claim 1, further comprising:
a third protection layer that includes inorganic material and is disposed between the second electrode and the first protection layer.

14. The organic EL display panel of claim 1, wherein the second protection layer is disposed between the auxiliary electrode layer and the first protection layer.

15. A method of manufacturing an organic EL display panel, comprising:
forming a plurality of first electrodes that are spaced away from each other and are arrayed in rows and columns above a substrate;
forming a plurality of light-emitting layers that include organic light-emitting material above the first electrodes;
forming a second electrode above the light-emitting layers;
forming a first protection layer through applying resin material above the second electrode excluding an auxiliary region which, in plan view, extends in a column direction between ones of the first electrodes that are adjacent in a row direction across the substrate;
forming a second protection layer through applying inorganic material above the first protection layer and the second electrode;
forming a contact opening in the second protection layer within the auxiliary region; and
forming an auxiliary electrode layer within the auxiliary region in the column direction, the auxiliary electrode layer electrically connecting to the second electrode through the contact opening.

16. An organic electroluminescence (EL) display panel, comprising:
a substrate;
a plurality of first electrodes arrayed in rows and columns above the substrate, wherein adjacent first electrodes of the plurality of first electrodes are spaced from each other;
a plurality of light-emitting layers, wherein each of the plurality of light-emitting layers is over a corresponding first electrode of the plurality of first electrodes, and each of the plurality of light-emitting layers comprises an organic material;
a second electrode over the plurality of light-emitting layers;
a first protection layer over the second electrode, wherein the first protection layer fails to extend into an auxiliary region which, in plan view, extends in a column direction between the adjacent first electrodes, and the first protection layer comprises a resin;
a second protection layer over the first protection layer and the second electrode, wherein the second protection layer comprises an inorganic material;
an auxiliary electrode layer that extends in the column direction within the auxiliary region and is electrically connected to the second electrode within the auxiliary region;
a plurality of first partition walls between the auxiliary region and a light emitting region, wherein each of the plurality of first partition walls has a first height;
a second partition wall between adjacent first partition walls of the plurality of first partition walls, wherein the second partition wall has a second height different from the first height.

17. The organic EL display of claim 16, wherein the second height is greater than the first height.

18. The organic EL display of claim 16, wherein the second protection layer is between the auxiliary electrode layer and the first protection layer.

19. The organic EL display of claim 16, further comprising a third protection layer, wherein the third protection layer directly contacts the second protection layer in the auxiliary region.

20. The organic EL display of claim 19, wherein the first protection layer is between the second protection layer and the third protection layer outside of the auxiliary region.

* * * * *